(12) United States Patent
Shin

(10) Patent No.: US 12,389,095 B2
(45) Date of Patent: Aug. 12, 2025

(54) CAMERA MODULE INCLUDING AN IMAGE SENSOR

(71) Applicant: LG INNOTEK CO., LTD., Seoul (KR)

(72) Inventor: Won Seob Shin, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 61 days.

(21) Appl. No.: 18/262,847

(22) PCT Filed: Jan. 25, 2022

(86) PCT No.: PCT/KR2022/001309
§ 371 (c)(1),
(2) Date: Jul. 25, 2023

(87) PCT Pub. No.: WO2022/158941
PCT Pub. Date: Jul. 28, 2022

(65) Prior Publication Data
US 2024/0089570 A1 Mar. 14, 2024

(30) Foreign Application Priority Data

Jan. 25, 2021 (KR) .................. 10-2021-0010417

(51) Int. Cl.
*H04N 23/52* (2023.01)
*H04N 23/54* (2023.01)
(Continued)

(52) U.S. Cl.
CPC .............. *H04N 23/52* (2023.01); *H04N 23/54* (2023.01); *H04N 25/77* (2023.01);
(Continued)

(58) Field of Classification Search
CPC ........ H04N 23/52; H04N 23/54; H04N 25/77; H04N 23/57; H05K 1/0271;
(Continued)

(56) References Cited

U.S. PATENT DOCUMENTS 5,545,589 A * 8/1996 Tomura ................... H01L 24/11
438/665
2007/0122146 A1 5/2007 Ryu
(Continued)

FOREIGN PATENT DOCUMENTS

JP 2005322947 A 11/2005
JP 2019068140 A 4/2019
(Continued)

OTHER PUBLICATIONS

International Search Report dated May 10, 2022 in International Application No. PCT/KR2022/001309.

*Primary Examiner* — Padma Haliyur
(74) *Attorney, Agent, or Firm* — Saliwanchik, Lloyd & Eisenschenk

(57) ABSTRACT

A camera module according to an embodiment includes a reinforcing plate; a bump part disposed on the reinforcing plate; a substrate disposed on the reinforcing plate and including a cavity vertically overlapping the bump part; and an image sensor disposed on the bump part, wherein the bump part includes a first bump disposed on the reinforcing plate and having a first height; and a second bump disposed on the first bump and having a second height different from the first height; and wherein an upper surface of the second bump is in direct contact with a lower surface of the image sensor.

20 Claims, 11 Drawing Sheets

(51) Int. Cl.
*H04N 25/77* (2023.01)
*H05K 1/02* (2006.01)
(52) U.S. Cl.
CPC . *H05K 1/0271* (2013.01); *H05K 2201/10151* (2013.01); *H05K 2201/10287* (2013.01)
(58) Field of Classification Search
CPC .......... H05K 2201/10151; H05K 2201/10287; H05K 2201/10083; H05K 3/0061; H05K 3/4007
See application file for complete search history.

(56) References Cited

U.S. PATENT DOCUMENTS

| | | | |
|---|---|---|---|
| 2016/0104685 A1* | 4/2016 | Shen | H01L 24/16 257/737 |
| 2019/0096944 A1* | 3/2019 | Okada | H01L 27/14636 |
| 2019/0174087 A1 | 6/2019 | Kim et al. | |
| 2019/0181111 A1* | 6/2019 | Kim | H01L 27/124 |
| 2021/0021744 A1 | 1/2021 | Kim et al. | |
| 2021/0067669 A1* | 3/2021 | Park | H01L 27/14618 |
| 2021/0281756 A1* | 9/2021 | Park | H05K 1/0278 |

FOREIGN PATENT DOCUMENTS

| | | |
|---|---|---|
| KR | 10-0704980 B1 | 4/2007 |
| KR | 20-20090004352 U | 5/2009 |
| KR | 10-20190066196 A | 6/2019 |
| KR | 10-20190070369 A | 6/2019 |
| KR | 10-20190110226 A | 9/2019 |

\* cited by examiner (a)

(b)

(c)

CAMERA MODULE INCLUDING AN IMAGE SENSOR

CROSS-REFERENCE TO RELATED APPLICATIONS

This application is the U.S. national stage application of International Patent Application No. PCT/KR2022/001309, filed Jan. 25, 2022, which claims the benefit under 35 U.S.C. § 119 of Korean Application No. 10-2021-0010417, filed Jan. 25, 2021, the disclosures of each of which are incorporated herein by reference in their entirety.

TECHNICAL FIELD

An embodiment relates to a camera module and an optical device including the same.

BACKGROUND ART

Recently, miniature camera modules have been developed, and the miniature camera modules are widely used in small electronic products such as smart phones, notebook computers, and game devices.

That is, most mobile electronic devices, including smartphones, are equipped with a camera device for obtaining an image from an object, and the mobile electronic devices are gradually becoming smaller for easy portability.

Such a camera device generally may include a lens through which light is incident, an image sensor that captures light incident through the lens, and a plurality of components for transmitting and receiving electrical signals for images obtained from the image sensor to an electronic device equipped with a camera device. In addition, these image sensors and components are generally mounted on a printed circuit board and connected to an external electronic device.

On the other hand, the conventional camera device uses a printed circuit board so that the image sensor is located at a high position. However, when the image sensor is directly mounted on the printed circuit board as described above, there is a problem in that heat generated from the image sensor is not emitted, and thus there is a reliability problem due to heat generation. Recently, the pixels or size of image sensors are increasing for high resolution, and thus the heat problem of the image sensor further affects the performance of the camera device.

In addition, a printed circuit board in a conventional camera device is disposed on a reinforcing plate such as a stiffener, and the image sensor is disposed on the reinforcing plate, and then is connected to the printed circuit board through wire bonding. In this case, a cavity exposing a surface of the reinforcing plate is formed in the printed circuit board. In this case, when the cavity type printed circuit board and the reinforcing plate are used, the heat dissipation problem can be solved while increasing the height of the image sensor. In such a camera device, an epoxy for bonding an image sensor is applied on the reinforcing plate, and the image sensor is disposed on the applied epoxy. However, the camera device as described above has a problem in that warpage occurs due to a difference between a coefficient of thermal expansion of the image sensor, a coefficient of thermal expansion of the printed circuit board, and a coefficient of thermal expansion of the epoxy. For example, thermal curing proceeds in a state in which an image sensor is disposed on the epoxy. In this case, when the thermal curing proceeds, the configuration including the reinforcing plate, the epoxy and the image sensor is heat-expanded and then contracted, and accordingly, there is a problem that the warpage phenomenon occurs severely in a shape like '∩'. In addition, when the warpage phenomenon of the image sensor occurs, there is a problem in that the resolution performance of the camera device is deteriorated, and thus the yield of the camera device is decreased.

Accordingly, there is a need for a method capable of minimizing the warpage of the image sensor.

DISCLOSURE

Technical Problem

An embodiment is to provide a camera module capable of minimizing the warpage phenomenon of an image sensor and an optical device including the same.

In addition, the embodiment provides a camera module capable of supporting an image sensor using a bump formed of a metal wire and an optical device including the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A camera module according to an embodiment comprises a reinforcing plate; a bump part disposed on the reinforcing plate; a substrate disposed on the reinforcing plate and including a cavity vertically overlapping the bump part; and an image sensor disposed on the bump part, wherein the bump part includes a first bump disposed on the reinforcing plate and having a first height; and a second bump disposed on the first bump and having a second height different from the first height; and wherein an upper surface of the second bump is in direct contact with a lower surface of the image sensor.

In addition, the reinforcing plate includes a region vertically overlapping the cavity, and the bump part is disposed in plurality on the region vertically overlapping the cavity among the upper surface of the reinforcing plate.

In addition, the bump part is not electrically connected to the image sensor.

In addition, the bump part is composed of a metal wire having a diameter in a range of 22 μm to 28 μm.

In addition, the first height of the first bump satisfies a range of 50% to 90% of the diameter of the metal wire.

In addition, the second height of the second bump satisfies a range of 115% to 170% of the diameter of the metal wire.

In addition, the first height of the first bump satisfies a range of 11 μm to 26 μm.

In addition, the second height of the second bump satisfies a range of 28 μm to 44 μm.

In addition, the first bump has a first width, and the second bump has a second width smaller than the first width.

In addition, the first width of the first bump satisfies a range of 70 μm to 97 m; and the second width of the second bump satisfies a range of 50 μm to 80 μm.

In addition, the camera module further comprises a first adhesive member disposed between the image sensor and the reinforcing plate; and a second adhesive member disposed between the substrate and the reinforcing plate.

In addition, an area of the first adhesive member is 50% or less of an area of the image sensor.

In addition, the plurality of bump parts overlap a corner region of the lower surface of the image sensor in an optical axis direction.

In addition, the bump part is spaced apart from an inner wall of the cavity of the substrate by a first separation distance.

In addition, the image sensor includes a pixel region and a passivation region around the pixel region, and the bump part overlaps the pixel region of the image sensor in an optical axis direction.

In addition, the pixel region of the image sensor includes an active pixel region; and a dummy pixel region between the active pixel region and the passivation region, wherein at least a portion of the second bump of the bump part overlaps the active pixel region in an optical axis direction.

In addition, the substrate includes a first terminal, the image sensor includes a second terminal, and a connection wire electrically connecting the first terminal and the second terminal, and wherein the connection wire is composed of the metal wire constituting the bump part.

Meanwhile, an optical device according to an embodiment comprises a main body; a camera module disposed in the main body and capturing an image of a subject; and a display unit disposed on the main body and outputting an image captured by the camera module, wherein the camera module includes a reinforcing plate; a substrate disposed on the reinforcing plate and including a cavity and a first terminal; a bump part disposed on the reinforcing plate and exposed through the cavity of the substrate; an image sensor disposed on the bump part and including a second terminal; and a wire part connecting the first terminal and the second terminal, wherein the bump part includes a first bump disposed on the reinforcing plate and having a first height; and a second bump disposed on the first bump and having a second height different from the first height, wherein an upper surface of the second bump is in direct contact with a lower surface of the image sensor, wherein the bump part is composed of a metal wire having a diameter in a range of 22 μm to 28 μm, wherein the first height of the first bump satisfies a range of 50% to 90% of the diameter of the metal wire, and wherein the second height of the second bump satisfies a range of 115% to 170% of the diameter of the metal wire.

Effects of the Invention

A camera module and an optical device including the camera module according to the embodiment include a bump part. The bump part may be formed by bonding a metal wire on a reinforcing plate. In this case, a region overlapping the image sensor in an optical axis direction among the upper surface of the reinforcing plate includes a region in which the bump part is disposed, and a region in which an adhesive member for attaching or fixing the image sensor is disposed. In other words, the adhesive member may be selectively disposed on a region of the upper surface of the reinforcing plate in which the bump part is not formed. In addition, the embodiment may be attached or fixed on the reinforcing plate by the adhesive member in a state in which at least a portion of the lower surface of the image sensor is in direct contact with and supported by the bump part. Accordingly, the embodiment may minimize a warpage phenomenon of the image sensor by allowing at least a part of the image sensor to directly contact and support the bump part, thereby improving the operation reliability of the camera module.

Furthermore, in the embodiment, at least a portion of the image sensor is in direct contact with the bump part, and the bump part is in direct contact with the reinforcing plate, so that heat generated from the image sensor can be efficiently transferred to the outside.

In addition, the embodiment allows an area of the adhesive member disposed on the lower surface of the image sensor to be smaller than an area of the lower surface of the image sensor. Accordingly, the embodiment may minimize the warpage phenomenon of the image sensor that occurs as an arrangement area of the adhesive member increases compared to the area of the image sensor.

In addition, the embodiment allows at least a portion of an edge region of an active pixel region of the image sensor to be supported by the bump part in the optical axis direction. Accordingly, the embodiment may secure the flatness of the active pixel region, thereby improving the quality of the image obtained by the image sensor.

BEST MODE

Figure 1:
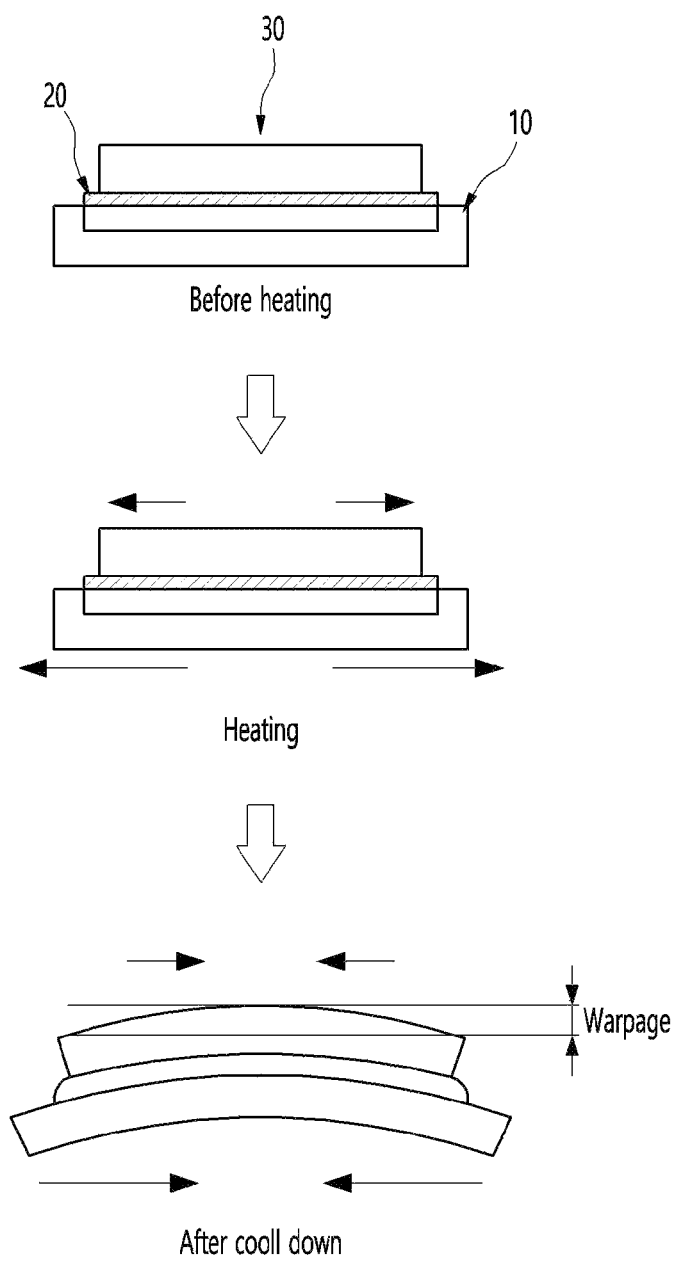
FIG. 1 is a view for explaining a warpage phenomenon of a camera module of a comparative example.

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (A, and (b) may be used.

These terms are only used to distinguish the elements from other elements, and the terms are not limited to the essence, order, or order of the elements. In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

An optical axis direction used below is defined as an optical axis direction of a camera actuator and a lens coupled to a camera module, and a vertical direction may be defined as a direction perpendicular to the optical axis.

"Auto focus function" used below is defined as a function for automatically adjusting a focus on a subject by adjusting a distance from an image sensor and moving a lens in the optical axis direction according to the distance of the subject so that a clear image of the subject may be obtained on the image sensor.

Meanwhile, "auto focus" may correspond to "AF (Auto Focus)". In addition, Closed-loop auto focus (CLAF) control may be defined as real-time feedback control of the lens position by sensing the distance between the image sensor and the lens to improve focus adjustment accuracy.

In addition, before a description of an embodiment of the present invention, a first direction may mean a x-axis direction shown in drawings, and a second direction may be a different direction from the first direction. For example, the second direction may mean a y-axis direction shown in the drawing in a direction perpendicular to the first direction. Also, a third direction may be different from the first and second directions. For example, the third direction may mean a z-axis direction shown in the drawing in a direction perpendicular to the first and second directions. Here, the third direction may mean an optical axis direction.

Hereinafter, a structure in a comparative example and problems thereof will be described before describing embodiments of the present application.

FIG. 1 is a view for explaining a warpage phenomenon of a camera module of a comparative example.

Referring to FIG. 1, the camera module of a comparative example has a structure including a reinforcing plate 10, an adhesive member 20 and an image sensor 30. The image sensor 30 is a sensor die constituting a sensor chip, and is generally a silicon (Si) die.

In this case, the reinforcing plate 10, the adhesive member 20 and the image sensor 30 (specifically, the silicon die) have different coefficients of thermal expansion (CTE). Here, the coefficient of thermal expansion means an amount of change in 'unit*length' caused by the change in 'unit * temperature'.

In the camera module of the comparative example as described above, a thermal curing process is performed in a state in which the adhesive member 20 is disposed on the reinforcing plate 10 and the image sensor 30 is disposed on the adhesive member 20. In addition, the image sensor 30 is attached to the reinforcing plate 10 by the thermal curing process.

In this case, as in a top view of FIG. 1, it can be seen that warpage does not occur when the reinforcing plate 10, the adhesive member 20, and the image sensor 30 are sequentially stacked before heating for the thermal curing process. For example, the flatness of the reinforcing plate 10, the adhesive member 20, and the image sensor 30 is maintained before the heat is applied.

And, as in a middle view of FIG. 1, when heat is applied to proceed with the thermal curing, the reinforcing plate 10, both ends of each of the adhesive member 20, and the image sensor 30 are expand in a longitudinal direction away from each other.

And, as in a bottom view of FIG. 1, when the thermal curing process is terminated and the cooling process proceeds (after cool down), each of the expanded reinforcing plate 10, the adhesive member 20 and the image sensor 30 is contracted to a state before expansion. That is, when heat is applied, each of the reinforcing plate 10, the adhesive member 20, and the image sensor 30 is in an expansion state based on a coefficient of thermal expansion.

In this case, the reinforcing plate 10, the adhesive member 20 and the image sensor 30 have different coefficients of thermal expansion. The coefficient of thermal expansion of each configuration is shown in Table 1 below.

TABLE 1

| Material | CTE $(((10-6 \text{ m}/(m \degree C.))$ |
|---|---|
| Silicon (image sensor die) | 3~5 |
| Epoxy (adhesive member) | 45~65 |
| Copper Alloys (reinforcing plate) | 17.6 |

As described above, the reinforcing plate 10 has a coefficient of thermal expansion of about 17.6 (10-6 m/(m° C.), the adhesive member 20 has a coefficient of thermal expansion in the range of 45 to 65 (10-6 m/(m° C.), and the image sensor 30 has a coefficient of thermal expansion in a range of 3 to 5 (10-6 m/(m° C.). That is, the adhesive member 20 disposed between the reinforcing plate 10 and the image sensor 30 has a highest coefficient of thermal expansion, and the image sensor 30 has a lowest coefficient of thermal expansion. Accordingly, as described above, the reinforcing plate 10, the adhesive member 20, and the image sensor 30 have different coefficients of thermal expansion, and accordingly, it expands and contracts with different expansion rates and contraction rates in the thermal curing process. Accordingly, the reinforcing plate 10, the adhesive member 20, and the image sensor 30 are warped in a '∩' shape due to the difference in expansion rate and contraction rate as described above.

In addition, when the warpage phenomenon of the image sensor occurs, there is a problem in that the resolution performance of the camera device is deteriorated, and thus the yield of the camera device is decreased.

Accordingly, the embodiment minimizes the warpage that occurs due to the difference in the coefficient of thermal expansion between the reinforcing plate 10, the image sensor 30 and the adhesive member 20, and accordingly, it is possible to improve the performance of the camera device.

Figure 2:
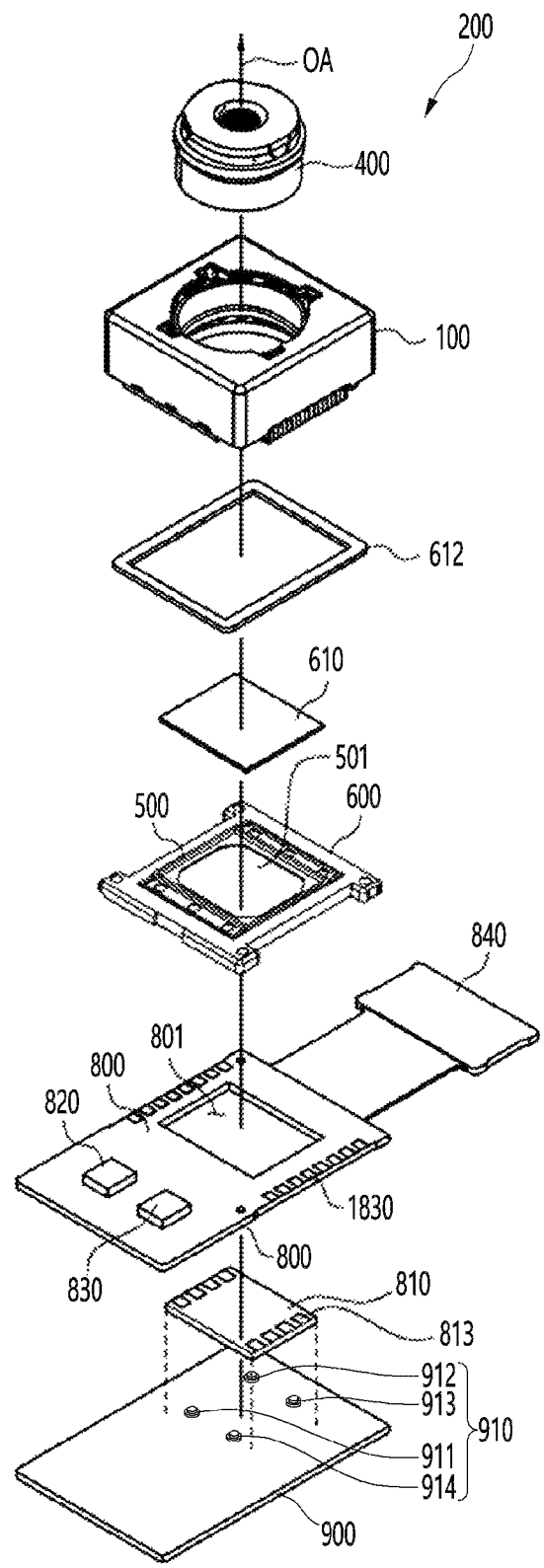
FIG. 2 is an exploded perspective view of a camera module according to an embodiment.
Figure 3:
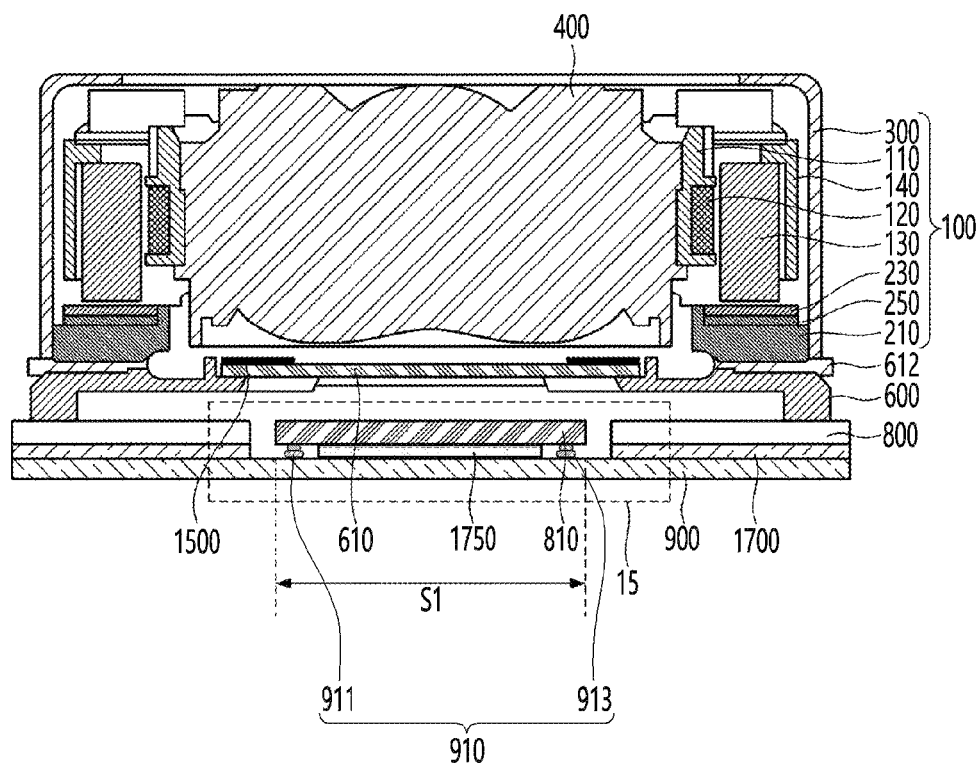
FIG. 3 is a cross-sectional view of the camera module of FIG. 1 according to an embodiment.
Figure 4:
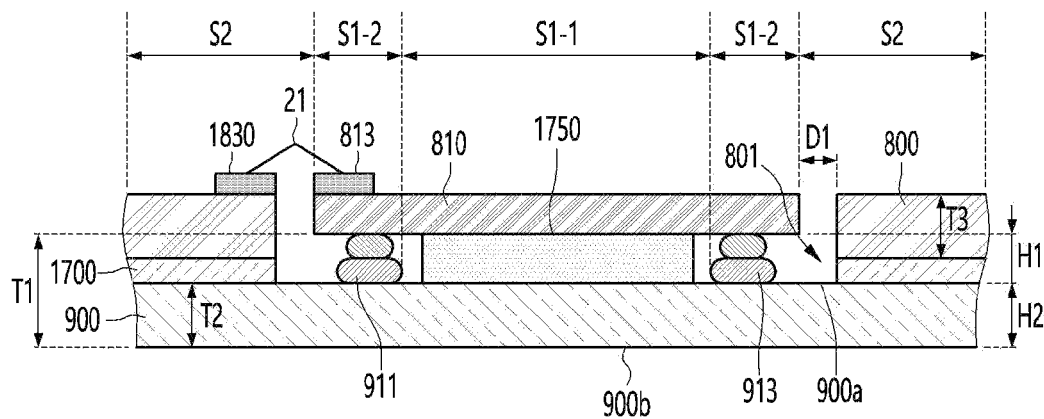
FIG. 4 is an enlarged view of a dotted line portion of FIG. 3.
Figure 5:
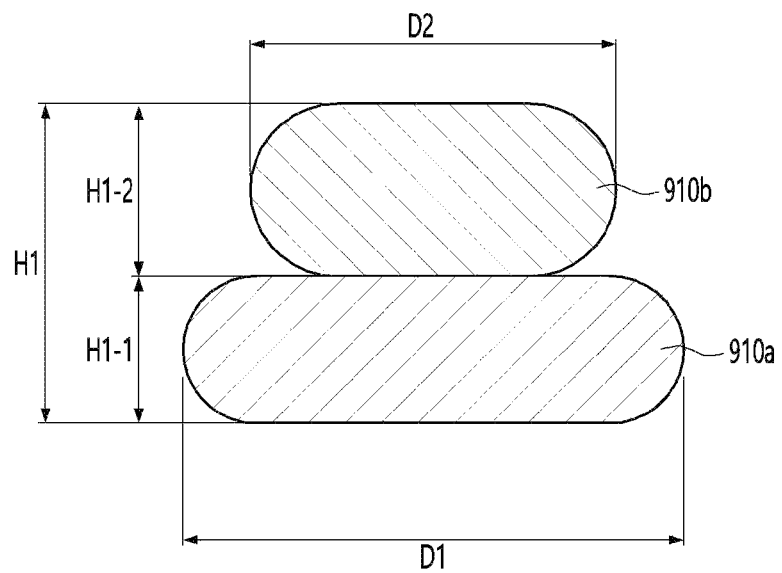
FIG. 5 is an enlarged view of a bump part according to an embodiment.

FIG. 2 is an exploded perspective view of a camera module according to an embodiment, FIG. 3 is a cross-sectional view of the camera module of FIG. 1 according to an embodiment, FIG. 4 is an enlarged view of a dotted line portion of FIG. 3, and FIG. 5 is an enlarged view of a bump part according to an embodiment.

Referring to FIGS. 2 to 5, the camera module 200 may include a lens or lens barrel 400, a lens driving device 100, a filter 610, a holder 600, a circuit board 800, a reinforcing plate 900 and an image sensor 810. Here, "camera module" may be expressed by replacing "capturing device" or "photographer", and the holder 600 may be expressed by replacing "sensor base".

In addition, the camera module 200 may further include a blocking member 1500 disposed on the filter 610.

In addition, the camera module 300 may further include a third adhesive member 612.

In addition, the camera module 300 may further include a motion sensor 820, a control unit 830, and a connector 840.

A lens or a lens barrel 400 may be mounted on a bobbin 110 of the lens driving device 100.

The lens driving device 100 may drive a lens or a lens barrel 400

The camera module 200 may be any one of a camera module for Auto Focus (AF) and a camera module for Optical Image Stabilizer (OIS). A camera module for AF refers to a thing capable of performing only an autofocus function, and an OIS camera module refers to a thing capable of performing an autofocus function and an OIS (Optical Image Stabilizer) function.

For example, the lens driving device 100 may be a lens driving device for AF or a lens driving device for OIS, where "for AF" and "for OIS" mean a camera module for AF and a camera module for OIS may be the same as described above.

For example, the lens driving device 100 of the camera module 200 may be a lens driving device for OIS.

The lens driving device 100 may include a housing 140, a bobbin 110 disposed in the housing 140 and for mounting a lens or lens barrel 400, a first coil 120 disposed on the bobbin 110, a magnet 130 disposed in the housing 140 and facing the first coil 120, at least one upper elastic member (not shown) coupled to an upper portion of the bobbin 110 and an upper portion of the housing 140, at least one lower elastic member (not shown) coupled to a lower portion of the bobbin 110 and a lower portion of the housing 140, a second coil 230 disposed under the bobbin 110 (or/and housing 140), a circuit board 250 disposed under the second coil 230; and a base 210 disposed under the circuit board 250.

In addition, the lens driving device 100 may be coupled to the base 210. The lens driving device 100 may include a cover member 300 accommodating components of the lens driving device 100 including the base 210.

In addition, the lens driving device 100 may include a support member (not shown) that electrically connects the circuit board 250 and the upper elastic member (not shown) and supports the housing 140 with respect to the base 210.

Each of the first coil 120 and the second coil 230 may be electrically connected to the circuit board 250. Each of the first coil 120 and the second coil 230 may receive a driving signal (driving current) from the circuit board 250.

*For example, the upper elastic member (not shown) may include a plurality of upper springs. In addition, a support member (not shown) may be connected to a plurality of upper springs of the upper elastic member. In addition, each of the first coil 120 and the second coil 230 may be electrically connected to the circuit board 250 through the support member. In addition, the first coil 120 and the second coil 230 may receive a driving signal (driving current) from the circuit board 250.

The first coil 120 may interact with the magnet 130 to generate a first electromagnetic force. In addition, the bobbin 110 and the lens or lens barrel 400 coupled thereto may be moved in the optical axis direction by the generated first electromagnetic force. Accordingly, in the embodiment, AF driving may be implemented as the displacement of the bobbin 110 in the optical axis direction is controlled.

In addition, the second coil 230 may interact with the magnet 130 to generate a second electromagnetic force. In addition, the housing 140 may be moved in a direction perpendicular to the optical axis by the generated second electromagnetic force. Accordingly, in an embodiment, image stabilization or OIS driving may be implemented as the housing is moved in a direction perpendicular to the optical axis.

In addition, the lens driving device 100 of the camera module 200 may further include a sensing magnet (not shown) disposed on the bobbin 110 and an AF position sensor (eg, a hall sensor, not shown) disposed on the housing 140 for AF feedback driving.

The lens driving device 100 may include a position sensor substrate (not shown) on which an AF position sensor is disposed or mounted and coupled to a housing or/and a base.

In another embodiment, the AF position sensor may be disposed on the bobbin, and the sensing magnet may be disposed on the housing. In addition, the lens driving device 100 may include a balancing magnet disposed on the bobbin 110 to correspond to the sensing magnet.

The AF position sensor may output an output signal according to a result of detecting the strength of the magnetic field of the sensing magnet according to a movement of the bobbin 100. In this case, the AF position sensor may be electrically connected to the circuit board 250 through the upper elastic member (or lower elastic member) and/or the supporting member. The circuit board 250 may provide a driving signal to the AF position sensor. In addition, an output of the AF position sensor may be transmitted to the circuit board 250.

In another embodiment, the lens driving device 100 may be a lens driving device for AF, and the AF lens driving device may include a housing, a bobbin disposed inside the housing, a coil disposed on the bobbin, a magnet disposed on the housing, at least one elastic member coupled to the bobbin and the housing, and a base disposed under the bobbin (or/and the housing).

For example, the elastic member may include the above-described upper elastic member and the lower elastic member.

A driving signal (eg, a driving current) may be provided to the coil, and the bobbin may be moved in the optical axis direction by electromagnetic force due to the interaction between the coil and the magnet.

In another embodiment, the coil may be disposed on the housing, and the magnet may be disposed on the bobbin.

In addition, the lens driving device for AF for AF feedback driving may further include a sensing magnet disposed on the bobbin, an AF position sensor (eg, a hall sensor) disposed on the housing, a circuit board disposed or mounted on the housing and/or the base, and a circuit board on which the AF position sensor is disposed and disposed or mounted to the housing and/or base. In another embodiment, the AF position sensor may be disposed on the bobbin, and the sensing magnet may be disposed on the housing.

The camera module according to another embodiment may include a housing coupled to a lens or a lens barrel 400 instead of the lens driving device 100 of FIG. 2 and fixing the lens or the lens barrel 400. The housing may be coupled or attached to an upper surface of a holder 600. The housing attached or fixed to the holder 600 may not be moved, and the position of the housing may be fixed while being attached to the holder 600.

The circuit board may be electrically connected to the coil and the AF position sensor, a driving signal may be provided to each of the coil and the AF position sensor through the circuit board, and the output of the AF position sensor may be transmitted to the circuit board.

The holder 600 may be disposed under the base 210 of the lens driving device 100.

The filter 610 is mounted on the holder 600. To this end, the holder 600 may include a seating part 500 on which the filter 610 is seated.

A third adhesive member 612 may couple or attach the base 210 of the lens driving device 100 to the holder 600. For example, a third adhesive member 612 may be disposed between a lower surface of the base 210 and an upper surface of the holder 600, and may adhere them to each other.

The third adhesive member 612 may serve to inhibit foreign substances from being introduced into the lens driving device 100 in addition to the above-described adhesive role. For example, the third adhesive member 612 may be an epoxy, a thermosetting adhesive, or an ultraviolet curable adhesive.

The filter 610 may be disposed in the seating part 500 of the holder 600.

The seating part 500 of the holder 600 may include a protrusion (not shown) protruding from an upper surface of the holder 600, but is not limited thereto. In another embodiment, the seating part may be in the form of a recess, a cavity, or a hole recessed from the upper surface of the holder 600.

The protrusion of the seating part 500 may serve to inhibit a lower end of the lens or the lens barrel 400 from contacting or colliding with the filter 610 (or/and the blocking member 1500).

The protrusion of the seating part 500 may be formed to protrude along the side surface of the filter 610 in the optical axis direction. For example, the protrusion may be disposed around the side surface of the filter 610 to surround the side surface of the filter 610.

In addition, an inner surface of the protrusion of the seating part 500 may be provided to face the side surface of the filter 610, and they may be spaced apart from each other. Accordingly, the embodiment may secure a processing tolerance for easily mounting the filter 610 inside the seating part 500 of the holder 600.

In addition, an upper surface of the protrusion of the seating part 500 may be located higher than the upper surface of the filter 610 in the optical axis direction. This is to inhibit the lens or the lower end of the lens barrel 400 from directly colliding with the filter 610 when the lens or the lens barrel 400 is mounted on the lens driving device 100 and moves in the optical axis direction or moves in the direction toward the filter 610 by an external impact.

The shape of the protrusion of the seating part 500 viewed from the upper side may match a shape of the filter 610, but is not limited thereto. In another embodiment, the shape of the protrusion of the seating part 500 may be similar to or different from the shape of the filter 610.

The holder 600 may include an opening 501 formed at a portion where the filter 610 is mounted or disposed so that light passing through the filter 610 may be incident on the image sensor 810.

For example, the opening 501 may pass through the holder 600 in the optical axis direction, and may be expressed by replacing "through hole".

For example, the opening 501 may pass through a center of the holder 600 and may be provided in the seating part 500, and an area of the opening 501 may be smaller than an area of the filter 610.

The holder 600 is disposed on the circuit board 800, and may accommodate the filter 610 therein. The holder 600 may support the lens driving device 100 positioned on an upper side. The lower surface of the base 210 of the lens driving device 100 may be disposed on an upper surface of the holder 600.

For example, the lower surface of the base 210 of the lens driving device 100 may be in contact with the upper surface of the holder 600 and may be supported by the upper surface of the holder 600.

For example, the filter 610 may be disposed in the seating portion 500 of the holder 600.

The filter 610 may serve to block light of a specific frequency band in light passing through the lens barrel 400 from entering the image sensor 810.

For example, the filter 610 may be an infrared cut filter, but is not limited thereto. For example, the filter 610 may be disposed to be parallel to an x-y plane perpendicular to the optical axis OA.

The filter 610 may be attached to the seating part 500 of the holder 600 by an adhesive member (not shown) such as UV epoxy.

The circuit board 800 may be disposed under the holder 600, and the holder 600 may be disposed on the upper surface of the circuit board 800.

The holder 600 may be attached to or fixed to the upper surface of the circuit board 800 by an adhesive member such as an epoxy, a thermosetting adhesive, or an ultraviolet curable adhesive. In this case, the adhesive member may be disposed between the lower surface of the holder 600 and the upper surface of the circuit board 800.

The circuit board 800 may have a cavity 801 corresponding to the opening 501 of the holder 600. The cavity 801 of the circuit board 800 may be in the form of a through hole passing through the circuit board 800 in the optical axis direction.

An image sensor 810 may be disposed in the cavity 801 of the circuit board 800. For example, at least a portion of the image sensor 810 may be positioned in the cavity 801 of the circuit board 800.

The reinforcing plate 900 is disposed under the circuit board 800. For example, the reinforcing plate 900 may be disposed on a lower surface of the circuit board 800 to cover the cavity 801 at a lower portion of the circuit board 800.

In this case, the reinforcing plate 900 may include a bump part 910. Specifically, the bump part 910 may be disposed on the upper surface of the reinforcing plate 900. In this case, the bump part 910 may overlap the cavity 801 of the circuit board 800 in the optical axis direction. For example, the upper surface of the reinforcing plate 900 may include a contact region contacting the circuit board 800 and an exposed region exposed by the cavity 801. In addition, the bump part 910 may be disposed on an exposed region of the reinforcing plate 900. Accordingly, the bump part 910 may be exposed through the cavity 801 of the circuit board 800 in a state where the circuit board 800 is disposed on the reinforcing plate 900.

The bump part 910 may be attached to the reinforcing plate 900 through a thermal compression method or an ultrasonic compression method. Specifically, the bump part 910 may be a wire bonded to an upper surface of the reinforcing plate 900. For example, the bump part 910 may be formed by bonding a metal wire to the upper surface of the reinforcing plate 900.

In this way, the embodiment forms a bump part 910 through bonding of a metal wire on the reinforcing plate 900. In addition, in the embodiment, a process of attaching or mounting the image sensor 810 is performed in a state where the image sensor 810 is positioned on the formed bump part 910.

In this case, in the process of attaching or mounting the image sensor 810, a specific region on the lower surface of the image sensor 810 may be supported by the bump part 910. Accordingly, in the embodiment, it is possible to solve a warpage problem in which an edge region of the image sensor 810 is bent downward compared to a center region. Accordingly, in the embodiment, it is possible to improve operation reliability by minimizing the occurrence of warpage of the image sensor 810. For example, as described with reference to FIG. 1, in the image sensor 810, smile warpage such as '∩' in which the edge region is bent downward with respect to the center region occurs. In this case, the edge region of the image sensor 810 in the embodiment is supported by the bump part 910 disposed on the exposed region of the reinforcing plate 900. Accordingly, in the embodiment, it is possible to solve the problem that the edge region of the image sensor 810 is bent downward.

The bump part 910 may protrude from the upper surface of the reinforcing plate 900 in the optical axis direction. In addition, the image sensor 810 may be exposed through the cavity 801 of the circuit board 800 while being supported by the bump part 910.

Meanwhile, the image sensor 810 supported by the bump part 910 may be electrically connected to the circuit board 800 through a connection wire 21. For example, the connection wire 21 may connect the terminal 813 of the image sensor 810 and the terminal 1830 of the circuit board 800 to each other.

That is, the lower surface of the image sensor 810 in the embodiment contacts the bump part 910. In addition, the terminal 813 provided on the upper surface of the image sensor 810 is electrically connected to the circuit board 800 through the connection wire 21.

In this case, the bump part 910 and the connection wire 21 may be formed using a metal wire made of the same material. Alternatively, the bump part 910 and the connection wire 21 may be formed using wires made of different metals. That is, the bump part 910 serves to support the image sensor 810, not to transmit electrical signals. Accordingly, the bump part 910 may include a metal material that can be attached on the reinforcing plate 900 through bonding regardless of signal transmission performance. For example, the bump part 910 may be formed using a metal wire of at least one of gold (Au), copper (Cu), aluminum (Al), and silver (Ag). Meanwhile, the connection wire 21 serves as a wire electrically connecting the circuit board 800 and the image sensor 810. Accordingly, the connection wire 21 may include a metal wire capable of signal transmission and having optimal signal transmission performance. However, in the embodiment, for convenience in the manufacturing process of the camera module, the bump part 910 and the connection wire 21 are respectively formed using the metal wire made of the same material. Preferably, the bump part 910 and the connection wire 21 may be formed of a metal wire containing gold (Au).

The reinforcing plate 900 is a plate-like member having a predetermined thickness and hardness, and can stably support the image sensor 810 and inhibit damage to the image sensor due to external impact or contact.

In addition, the reinforcing plate 900 may improve a heat dissipation effect of dissipating heat generated from the image sensor 810 to the outside. To this end, the reinforcing plate 900 may be formed of a metal material having high thermal conductivity. For example, the reinforcing plate 900 may include SUS or aluminum, but is not limited thereto. For example, the reinforcing plate 900 in another embodiment may be formed of glass epoxy, plastic, or synthetic resin.

In addition, the reinforcing plate 900 may serve as a ground for protecting the camera module from electrostatic discharge protection (ESD) by being electrically connected to a ground terminal (not shown) of the circuit board 800. To this end, the circuit board 800 includes a ground terminal (not shown), and the ground terminal (not shown) may be exposed to a lower surface of the circuit board 800. In addition, the reinforcing plate 900 may be electrically connected to the exposed ground terminal (not shown) of the circuit board 800.

The reinforcing plate 900 may include a surface treatment layer (not shown) on an upper surface. For example, the reinforcing plate 900 may include a surface treatment layer containing nickel (Ni) on the surface. The surface treatment layer may be formed on an entire region of the upper surface of the reinforcing plate 900. Alternatively, the surface treatment layer may be formed on the exposed region of the upper surface of the reinforcing plate 900. Alternatively, the surface treatment layer may be selectively formed on a region where the bump part 910 is to be disposed among the exposed region of the reinforcing plate 900. The surface treatment layer may improve adhesion between the bump part 910 and the reinforcing plate 900.

That is, the bump part 910 may be formed by bonding a metal wire on the reinforcing plate 900. In this case, as described above, the metal wire constituting the bump part 910 may include gold (Au). And, as described above, the reinforcing plate 900 may include SUS or aluminum. In this case, when the metal wire containing gold (Au) is directly bonded to the reinforcing plate 900, bonding properties may be deteriorated. For example, when the bump part 910 is directly formed on the reinforcing plate 900, bonding strength between the reinforcing plate 900 and the bump part 910 may decrease. To this end, in the embodiment, the surface treatment layer is formed on the upper surface of the reinforcing plate 900. The surface treatment layer of the reinforcing plate 900 may include a metal material having high bonding properties with the metal wire. For example, the surface treatment layer may include a nickel metal layer containing nickel. For example, the surface treatment layer may include a first surface treatment layer containing nickel (Ni) disposed on the upper surface of the reinforcing plate 900 and a second surface treatment layer containing palladium (Pd) disposed on the first surface treatment layer. The surface treatment layer of the reinforcing plate 900 may include a metal capable of improving bonding properties with the bump part 910 while inhibiting oxidation of an exposed region of the reinforcing plate 900 exposed through the cavity 801 of the circuit board 800.

The image sensor 810 may be a portion on which the light passing through the filter 610 is incident to form an image included in the light.

The circuit board 800 may be provided with various circuits, elements, control units, etc. in order to convert an image formed on the image sensor 810 into an electrical signal and transmit it to an external device. A circuit pattern electrically connected to an image sensor and various devices may be formed on the circuit board 800.

The holder 600 may be represented by replacing a first holder, and the circuit board 800 may be represented by replacing a second holder.

The image sensor 810 may receive an image included in light incident through the lens driving device 100 and convert the received image into an electrical signal.

The filter 610 and the image sensor 810 may be spaced apart to face each other in the optical axis OA direction or the first direction.

In addition, the protrusion 500*a* of the holder 600 may be disposed to face the filter 610 in the optical axis direction.

The blocking member 1500 may be disposed on the upper surface of the filter 610. The blocking member 1500 may be replaced with a "masking unit".

For example, the blocking member 1500 may be disposed on a corner region of the upper surface of the filter 610, and serve to block at least a portion of light incident toward the corner region of the filter 610 through the lens or lens barrel 400 from passing through the filter 610. For example, the blocking member 1500 may be coupled or attached to the upper surface of the filter 1610.

For example, the filter 610 may be formed in a rectangular shape viewed in the optical axis direction, and the blocking member 1500 may be formed symmetrically with respect to the filter 610 along each side of the upper surface of the filter 610.

In this case, the blocking member 1500 may be formed to have a constant width at each side of the upper surface of the filter 1610.

The blocking member 1500 may be formed of an opaque material. For example, the blocking member 1500 may be provided in the form of an opaque adhesive material applied to the filter 610 or in the form of a film attached to the filter 610.

The filter 610 and the image sensor 810 may be disposed to face each other in the optical axis direction, and the blocking member 1500 may at least partially overlap the terminal 1830 and/or the connection wire 21 disposed on the circuit board 800 in the optical axis direction.

The connection wire 21 and the terminal 1830 may be formed of a conductive material, for example, gold (Au), silver (Ag), copper (Cu), a copper alloy, etc., and such a conductive material may have a property of reflecting light. The light passing through the filter 610 may be reflected by the terminal 1830 and the connection wire 21 of the circuit board 800, and an instantaneous flashing, that is, a flare phenomenon may occur by this reflected light, and such a flare phenomenon may distort an image formed on the image sensor 810 or deteriorate image quality.

The blocking member 1500 is disposed so that at least a portion overlaps with the terminal 1830 and/or the connection wire 21 in the optical axis direction, thereby, it is possible to block the light directed to the terminal 1830 of the circuit board 800, and/or the connection wire 21 among the light passing through the lens or the lens barrel 400. Accordingly, the embodiment may inhibit the occurrence of the above-described flare phenomenon through the blocking member 1500, and may solve problems such as distortion or deterioration of image quality formed on the image sensor 810.

A motion sensor 820 may be mounted or disposed on the circuit board 800, and may be electrically connected to the controller 830 through a circuit pattern (not shown) provided on the circuit board 800.

The motion sensor 820 outputs rotational angular velocity information by the movement of the camera module 200. The motion sensor 820 may be implemented as a 2-axis or 3-axis gyro sensor or an angular velocity sensor.

A control unit 830 is mounted or disposed on the circuit board 800.

*The circuit board 800 may be electrically connected to the lens driving device 100. For example, the circuit board 800 may be electrically connected to the circuit board 250 of the lens driving device 100.

For example, a driving signal may be provided to each of the first coil 120 and the second coil 230 of the lens driving device 100 through the circuit board 800, and a drive signal may be provided to the AF position sensor (or OIS position sensor). Also, the output of the AF position sensor (or OIS position sensor) may be transmitted to the circuit board 800.

The connector 840 is electrically connected to the circuit board 800, and may include a port for electrically connecting to an external device.

A first adhesive member 1750 may be disposed between the lower surface of the image sensor 810 and the reinforcing plate 900, and the image sensor 810 may be attached or fixed on the reinforcing plate 10 by the first adhesive member 1750. For example, the image sensor 810 may be attached or fixed on the exposed region of the reinforcing plate 900 through the first adhesive member 1750 while being supported by the bump part 910.

In this case, the reinforcing plate 900 may be divided into a plurality of regions. For example, the upper surface of the reinforcing plate 900 may include a first region S1 and a second region S2. The first region S1 may be a region overlapping the image sensor 810 in the optical axis direction OA. The first region S1 may be a region overlapping a portion of the cavity 801 of the circuit board 800 in the optical axis direction OA.

The first region S1 may be a region to which the image sensor 810 is attached. The second region S2 may be a region where the second adhesive member 1700 is disposed. The second region S2 may be a region overlapping the other portions of the circuit board 800 except for a part of the cavity 801 in the optical axis direction OA.

In addition, the bump part 910 may be formed on the first region S1 of the upper surface of the reinforcing plate 900.

The image sensor 810 may be supported or fixed to the bump part 910. For example, at least a portion of a lower surface of the image sensor 810 may be in direct contact with the bump part 910. That is, the first adhesive member 1750 in the embodiment may be selectively formed in a region of the first region S1 in which the bump part 910 is not disposed. Accordingly, at least a first portion of the lower surface of the image sensor 810 may be in direct contact with the bump part 910, and at least a second portion of the image sensor 810 may be in direct contact with the first adhesive member 1750. That is, the second portion of the image sensor 810 may be attached or fixed to the first adhesive member 1750 in a state in which the first portion is supported by the bump part 910. Accordingly, at least a portion of the image sensor 810 in an embodiment may be in direct contact with the bump part 910 to minimize the warpage of the image sensor 810. For example, the bump part 910 may inhibit the image sensor 810 attached or fixed to the first adhesive member 1750 from being tilted.

In addition, the embodiment can efficiently transfer heat generated from the image sensor 810 to the outside by allowing at least a portion of the image sensor 810 to directly contact the bump part 910. For example, the bump part 910 may additionally perform a function of transferring heat generated from the image sensor 810 to the reinforcing plate 900 in addition to supporting the image sensor 810. Accordingly, the embodiment can solve the warpage of the image sensor 810 by using the bump part 910 and further improve the heat dissipation properties of the image sensor 810.

Accordingly, an area of the image sensor 810 in the embodiment may be larger than an area of the first adhesive member 1750. That is, only a portion of the area of the image sensor 810 may contact the first adhesive member 1750. For example, a first portion of the lower surface of the image sensor 810 may contact the bump part 910, and a second portion other than the first portion may contact the first adhesive member 1750.

In this case, the bump part 910 and the first adhesive member 1750 may be spaced apart from each other on the reinforcing plate 900.

Accordingly, the lower surface of the image sensor 810 may be divided into at least three regions. That is, the lower surface of the image sensor 810 may include a first portion in contact with the bump part 910, a second portion contacting the first adhesive member 1750, and a third portion corresponding to a separation region between the first portion and the second portion.

The first adhesive member 1750 may be an epoxy, a thermosetting adhesive, an ultraviolet curable adhesive, an adhesive film, or the like, but is not limited thereto.

In addition, a second adhesive member 1700 may be disposed between the lower surface of the circuit board 800 and the upper surface 900a of the second region S2 of the reinforcing plate 900, and the circuit board 800 may be attached to or fixed to the reinforcing plate 900 by the second adhesive member 1700. For example, the second adhesive member 1700 may be an epoxy, a thermosetting adhesive, an ultraviolet curable adhesive, or an adhesive film, but is not limited thereto.

On the other hand, a ratio of a first height H1 from the upper surface 900a of the second region S2 of the reinforcing plate 900 to the uppermost end of the bump part 910 and a second height H2 from the lower surface 900b of the reinforcing plate 900 to the upper surface 900a of the second region S2 of the reinforcing plate 900 (H1:H2) may be 1:0.67 to 1:2.1.

In this case, when a value (H2/H1) obtained by dividing the second height by the first height is less than 0.67, the reinforcing plate 900 is easily bent or deformed to a level that does not support the circuit board 800.

In addition, when the value (H2/H1) obtained by dividing the second height by the first height exceeds 2.1, the protruding height of the wire part is insignificant and the flatness of the reinforcing plate 900 cannot be improved. In addition, when the value obtained by dividing the second height by the first height (H2/H1) exceeds 2.1, an effect of reducing a step in the optical axis direction between the upper surface of the image sensor 810 and the upper surface of the circuit board 800 is reduced, and thus reliability of wire bonding between the two cannot be secured. For example, H1 corresponding to the height of the bump part 910 may be 46 μm to 62 μm. Preferably, H1 corresponding to the height of the bump part 910 may be 48 μm to 60 μm. More preferably, H1 corresponding to the height of the bump part 910 may be 49 μm to 59 μm. The height of the bump part 910 will be described in more detail below.

Meanwhile, a height from a lower surface 900b of the reinforcing plate 900 to an uppermost end of the bump part 910 may be lower than a height of the upper surface of the circuit board 800 disposed on the reinforcing plate 900. For example, the reinforcing plate 900 may include a first region S1 and a second region S2, and the first region S1 may be a region to which the image sensor 810 is attached, and the second region S2 may be a region to which the circuit board 800 is attached.

In addition, the first region S1 may include a first-first region S1-1 in which the first adhesive member 1750 is disposed, and a first-second region S1-2 in which the bump part 910 is disposed. In addition, the first-first region S1-1 may have the same height as the second region S2.

The first region S1 of the reinforcing plate 900 may include a bump part 910 protruding in the optical axis direction with respect to the first-first region S1-1, and the image sensor 810 may be disposed on the upper surface of the bump part 910.

For example, the first-second region S1-2 of the first region S1 of the reinforcing plate 900 may include the bump part 910 positioned higher than the first-first region S1-1 and the second region S2 of the reinforcing plate 900.

Since the entire region of the reinforcement plate 900 has a constant thickness, the embodiment may not be affected by the overall height of the camera module. In addition, since the image sensor 810 is disposed in direct contact with the bump part 910, a height difference between the upper surface of the circuit board 800 and the upper surface of the image sensor 810 is reduced, so that, a length of the connection wire 21 that electrically connects the circuit board 800 and the image sensor 810 is shortened, and thereby, wire bonding reliability for the connection wire 21 may be improved.

A side surface of the image sensor 810 may be spaced apart from an inner wall of the cavity 801 of the circuit board 800 by a first separation distance D1. For example, the first separation distance D1 may be 100 μm to 250 μm. When the first separation distance D1 is less than 100 μm, an attachment tolerance for attaching the circuit board 800 to the reinforcing plate 900 may be reduced. In addition, when the attachment tolerance is reduced, misalignment occurs between the cavity 801 of the circuit board 800 and the bump part 910, and the circuit board 800 may be damaged due to a collision between the circuit board 800 and the bump part 910.

In addition, when the first separation distance D1 exceeds 250 μm, a length of the connection wire 21 may increase as the separation distance between the image sensor 810 and the inner wall of the cavity 801 of the circuit board 800 increases. In addition, when the length of the connection wire 21 increases, the bonding properties of the connection wire 21 may be deteriorated, and Furthermore, reliability may be deteriorated due to the inclusion of noise in the signal transmitted through the connection wire 21.

Meanwhile, the bump part 910 in the embodiment may include a plurality of bump parts spaced apart from each other with the first-first region S1-1 interposed in the first region S1 of the reinforcing plate 900. For example, the bump part 910 may include a first bump part 911, a second bump part 912, a third bump part 913, and a fourth bump part 914.

That is, the first region S1 of the reinforcing plate 900 may include a first-second region S1-2 in which the first bump part 911, the second bump part 912, the third bump part 913, and the fourth bump part 914 are disposed, and the first-first region S1-1 other than the first-second region S1-2. In addition, the first adhesive member 1750 may be selectively disposed in the first-first region S1-1.

Accordingly, the embodiment may support different regions of the lower surface of the image sensor 810 through the first bump part 911, the second bump part 912, the third bump part 913, and the fourth bump part 914. Accordingly, the embodiment may more stably support the image sensor 810 and thus minimize the warpage phenomenon. In addition, the embodiment can branch and provide heat generated from the image sensor 810 in different paths through a plurality of mutually separated bump parts, thereby improving heat dissipation performance.

In this case, positions where the first to fourth bump parts 911, 912, 913, and 914 are disposed may correspond to corner regions of the lower surface of the image sensor 810. For example, the image sensor 810 may have a square shape. In addition, the lower surface of the image sensor 810 may include four corner regions. Accordingly, the first to fourth bump parts 911, 912, 913, and 914 may respectively correspond to the four corner regions of the lower surface of the image sensor 810.

Hereinafter, the bump part 910 will be described in detail.

The bump part 910 in the embodiment may have a multi-layer structure. For example, each of the first to fourth bump parts 911, 912, 913, and 914 may have a plurality of layer structures. For example, each of the first to fourth bump parts 911, 912, 913, and 914 may have a two-layer structure. However, the embodiment is not limited thereto, and the number of layers of the bump part 910 may increase. However, the embodiment allows the bump part 910 to be formed in two layers so that the image sensor 810 can be stably supported by the bump part 910 while securing the height that the bump part 910 should have.

To this end, the bump part 910 may include a first bump 910a and a second bump 910b.

The first bump 910a may be disposed on an upper surface of the reinforcing plate 900. More preferably, the first bump 910a may be disposed on a surface treatment layer formed on an upper surface of the reinforcing plate 900.

A vertical cross-sectional shape of the first bump 910a may have an ellipse shape. However, the embodiment is not limited thereto, and the vertical cross-sectional shape of the first bump 910a may have a square shape.

A second bump 910b may be disposed on the first bump 910a. The second bump 910b may have a different thickness from a thickness of the first bump 910a. Preferably, the thickness of the second bump 910b may be greater than the thickness of the first bump 910a. That is, the second bump 910b is formed of the same metal wire as the first bump 910a. In this case, in the embodiment, the first bump 910a is formed on the reinforcing plate 900 by primary bonding, and the second bump 910b is formed on the first bump 910a by secondary bonding. In this case, in the process of forming the second bump 910b, the first bump 910a may be pressed by the second bump 910b, and accordingly, the first bump 910a may be formed to have a thickness thinner than that of the second bump 910b.

In this case, the thickness of the first bump 910a and the thickness of the second bump 910b may be expressed as the height of the first bump 910a and the height of the second bump 910b, respectively. For example, a height of the first bump 910a may mean a straight line distance from the lower surface of the first bump 910a to the upper surface. In addition, a height of the second bump 910b may mean a straight line distance from the lower surface to the upper surface of the second bump 910b.

Meanwhile, the first bump 910a may be formed by pressing a metal wire placed on the upper surface of the reinforcing plate 900 and bonding the pressed metal wire. Specifically, the first bump 910a may be a lumped portion on the reinforcing plate 900 as bonding proceeds while the metal wire is pressed. In addition, the second bump 910b may be formed by additionally bonding the metal wire on the first bump 910a.

In this case, before describing the bump part 910, the metal wire forming the first bump 910a and the second bump 910b may be gold (Au). In this case, the metal wire may have a certain diameter. For example, the metal wire may have a diameter of 22 μm to 28 μm. Preferably, the metal wire may have a diameter of 23 μm to 27 μm. More preferably, the metal wire may have a diameter of 24 μm to 26 μm. For example, the metal wire may have a diameter of 0.9 mil.

Here, the width and thickness of the bump part 910 may be determined according to the diameter of the metal wire. In addition, the diameter of the metal wire may have an optimal thickness and width of the bump part 910 in the embodiment.

For example, when the diameter of the metal wire is out of the range of 22 m to 28 μm, reliability of the bump part 910 may deteriorate. For example, when the diameter of the metal wire is smaller than 22 μm, it may be difficult to form the bump part 910 with a height or thickness corresponding to H1. For example, when the diameter of the metal wire is smaller than 22 μm, the number of layers of the bump part 910 may increase to satisfy H1 that the bump part 910 should have. In addition, when the number of layers of the bump part increases, a manufacturing process accordingly may become complicated. In addition, when the number of layers of the bump part increases, it may be difficult to align the bump parts of each layer accordingly. In addition, when the number of layers of the bump part increases, a difference in height between the first to fourth bump parts 911, 912, 913, and 914 may increase, and thus mounting reliability of the image sensor 810 may deteriorate.

In this case, when the height difference occurs between the first to fourth bump parts 911, 912, 913, and 914, the image sensor disposed on the first to fourth bump parts 911, 912, 913, and 914 810 also has an inclination corresponding to the height difference. In this case, in the camera module according to the embodiment, the lens barrel 400 may be inclined to correspond to the inclination angle of the image sensor 810 through active alignment. However, when the number of layers of the bump part 910 increases, the height difference between the first to fourth bump parts 911, 912, 913, and 914 increases accordingly, and accordingly, there may be difficulties in the active alignment process. Furthermore, when the height difference between the first to fourth bump parts 911, 912, 913, and 914 increases, a problem may occur in that a specific bump part does not come into contact with the image sensor 810, and thus the normal function of the bump part 910 may not be performed.

In addition, when the diameter of the metal wire is greater than 28 μm, the width of the bump part 910 may increase. For example, when the diameter of the metal wire is greater than 28 μm, the width of the bump part 910 may increase to correspond to H1 that the bump part 910 should have. In addition, when the width of the bump part 910 increases, an area occupied by the bump part 910 in the first region S1 may increase, so that an area where the first adhesive member 1750 is disposed may decrease. In addition, the adhesive strength of the image sensor 810 by the first adhesive member 1750 decreases as the area where the first adhesive member 1750 is disposed decreases to a certain level or more, and this can cause reliability problems. In addition, when the diameter of the metal wire is greater than 28 μm, the width of the bump part 910 may increase, and accordingly, the size of the cavity 801 of the circuit board 800 to secure a space in which the bump part 910 is disposed may increase or the first separation distance D1 may increase.

Accordingly, the embodiment allows to form the bump part 910 including the first bump 910a and the second bump 910b of the two-layer structure using a metal wire having a diameter in the range of 22 μm to 28 μm.

The first bump 910a may have a first-first height H1-1. The first-first height H1-1 may be 11 μm to 26 μm. Preferably, the first-first height H1-1 may be 12 μm to 25 μm. More preferably, the first-first height H1-1 may be 14 μm to 23 μm. When the first-first height H1-1 of the first bump 910a is smaller than 11 μm, the height of the second bump 910b may correspondingly increase. In this case, the height of the second bump 910b is limited, and accordingly, the bump part 910 must be formed in three or more layers to satisfy the first height H1 that the bump part 910 should have. In addition, the first-first height H1-1 of the first bump 910a may be determined by the diameter of the metal wire. In this case, as described above, the diameter of the metal wire is 22 μm to 28 am, and accordingly, it may be difficult to form the first bump 910a with a height lower than 11 μm using the metal wire. In addition, when the first-first height H1-1 of the first bump 910a is greater than 25 μm, the first width D1 of the first bump 910a may increase corresponding to the increase in the height of the first bump 910a. In addition, when the first width D1 of the first bump 910a increases, there are problems in that an arrangement area of the first adhesive member 1750 decreases, the size of the cavity 801 increases, or the first separation distance increases.

Meanwhile, the first-first height H1-1 of the first bump 910a may be determined by the diameter of the metal wire. Preferably, the first-first height H1-1 of the first bump 910a may be smaller than the diameter of the metal wire. For example, the first-first height H1-1 of the first bump 910a may satisfy 50% to 90% of the diameter of the metal wire. Preferably, the first-first height H1-1 of the first bump 910a may be 54% to 85% of the diameter of the metal wire. More preferably, the first-first height H1-1 of the first bump 910a may be 60% to 82% of the diameter of the metal wire.

Meanwhile, the first bump 910a may have a first width D1. For example, the first width D1 of the first bump 910a may be 70 μm to 97 μm. Preferably, the first width D1 of the first bump 910a may be 73 μm to 94 μm. More preferably, the first width D1 of the first bump 910a may be 75 μm to 92 μm. Here, the first width D1 of the first bump 910a may mean the diameter of the first bump 910a. For example, a horizontal cross-sectional shape of the first bump 910a may be a circular shape, and thus the first width D1 may mean a diameter of a circle of the first bump 910a. Meanwhile, a horizontal cross-sectional shape of the first bump 910a may be an ellipse. In this case, the first width D1 of the first bump 910a may mean a value at a portion having a greatest diameter in the ellipse. In addition, the horizontal cross-sectional shape of the first bump 910a may have a shape other than circular.

The second bump 910b is disposed on the first bump 910a.

In this case, the second bump 910b may have a first-second height H1-2 greater than the first-first height H1-1 of the first bump 910a. In addition, the second bump 910b may have a second width D2 smaller than the first width D1 of the first bump 910a.

The second bump 910b is disposed on the first bump 910a. In this case, in the process of forming the second bump 910b, the second bump 910b may press the first bump 910a. Accordingly, the height of the first bump 910a decreases and the width of the first bump 910a increases in the process of forming the second bump 910b. Accordingly, the height of the first bump 910a may be greater than the height of the second bump 910b, and the width of the first bump 910a may be greater than that of the second bump 910b.

The first-second height H1-2 of the second bump 910b may be 28 μm to 44 μm.

Preferably, the first-second height H1-2 of the second bump 910b may be 30 μm to 42 μm. More preferably, the first-second height H1-2 of the second bump 910b may be 31 μm to 41 μm. When the first-second height H1-2 of the second bump 910b is smaller than 28 am, an additional layer of bumps must be formed on the second bump 910b in order to satisfy the height H1 that the bump part 910 should have. In addition, when the first-second height H1-2 of the second bump 910b is greater than 44 μm, the second width D2 of the second bump 910b may increase. In addition, when the second width D2 of the second bump 910b increases, the first width D1 of the first bump 910a must also increase accordingly, and accordingly, there are problems in that an arrangement area of the first adhesive member 1750 decreases, the size of the cavity 801 increases, or the first separation distance increases.

Meanwhile, the first-second height H1-2 of the second bump 910b may be determined by the diameter of the metal wire. Preferably, the first-second height H1-2 of the second bump 910b may be greater than the diameter of the metal wire. For example, the first-second height H1-2 of the second bump 910b may be 115% to 170% of the diameter of the metal wire. Preferably, the first-second height H1-2 of the second bump 910b may be 135% to 150% of the diameter of the metal wire. More preferably, the first-second height H1-2 of the second bump 910b may be 140% to $1^{46}$% of the diameter of the metal wire.

Meanwhile, the second bump 910b may have a second width D2. For example, the second width D2 of the second bump 910b may be 50 μm to 80 μm. Preferably, the second width D2 of the second bump 910b may be 54 μm to 78 μm. More preferably, the second width D2 of the second bump 910b may be 57 μm to 73 μm. Here, the second width D2 of the second bump 910b may mean the diameter of the second bump 910b. For example, a horizontal cross-sectional shape of the second bump 910b may be a circular shape, and thus the second width D2 may mean a diameter of a circle of the second bump 910b. Meanwhile, the horizontal cross-sectional shape of the second bump 910b may be an ellipse. In this case, the second width D2 of the second bump 910b may mean a value at a portion having a greatest diameter in the ellipse. In addition, the horizontal cross-sectional shape of the second bump 910*b* may have a shape other than circular.

The camera module and the optical device including the camera module according to the embodiment include a bump part. The bump part may be formed by bonding a metal wire on a reinforcing plate. In this case, a region overlapping the image sensor in the optical axis direction of the upper surface of the reinforcing plate includes a region where the bump part is disposed and a region where an adhesive member for attaching or fixing the image sensor is disposed. That is, the adhesive member may be selectively disposed on a region of the upper surface of the reinforcing plate where the bump part is not formed. In addition, in the embodiment, at least a portion of the lower surface of the image sensor can be attached or fixed on the reinforcing plate by the adhesive member in a state where it is directly contacted and supported by the bump part. Accordingly, in the embodiment, at least a portion of the image sensor directly contacts and supports the bump part, thereby minimizing the bending of the image sensor and thereby improving the reliability of operation of the camera module.

Furthermore, in the embodiment, at least a portion of the image sensor directly contacts the bump part, and the bump part directly contacts the reinforcing plate, so that heat generated from the image sensor can be efficiently transferred to the outside.

Hereinafter, the structure of the reinforcing plate 900, the bump part 910, the first adhesive member 1750, and the image sensor 810 according to the embodiment and the arrangement relationship thereof will be described in detail.

Figure 6:
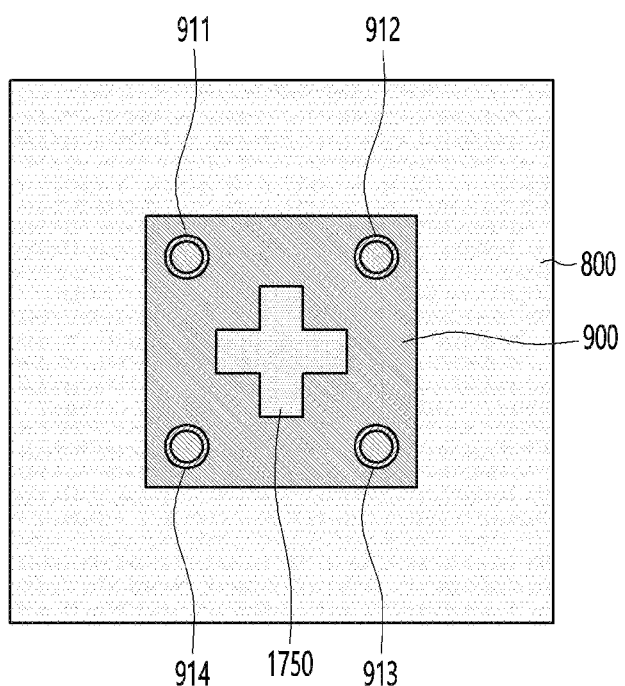
FIG. 6 is a plan view showing a circuit board, a reinforcing plate, a bump part, and a first adhesive member before an image sensor according to the first embodiment is attached.
Figure 7:
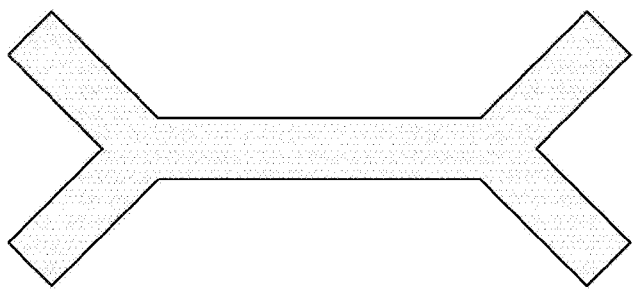
FIG. 7 is a view illustrating various embodiments of an arrangement shape of a first adhesive member.
Figure 7:
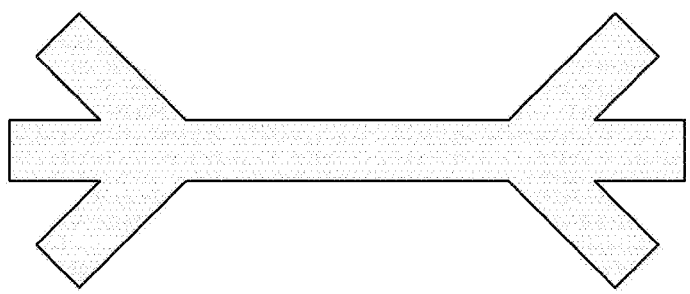
Figure 7:
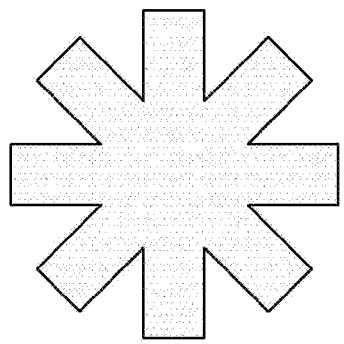
Figure 8:
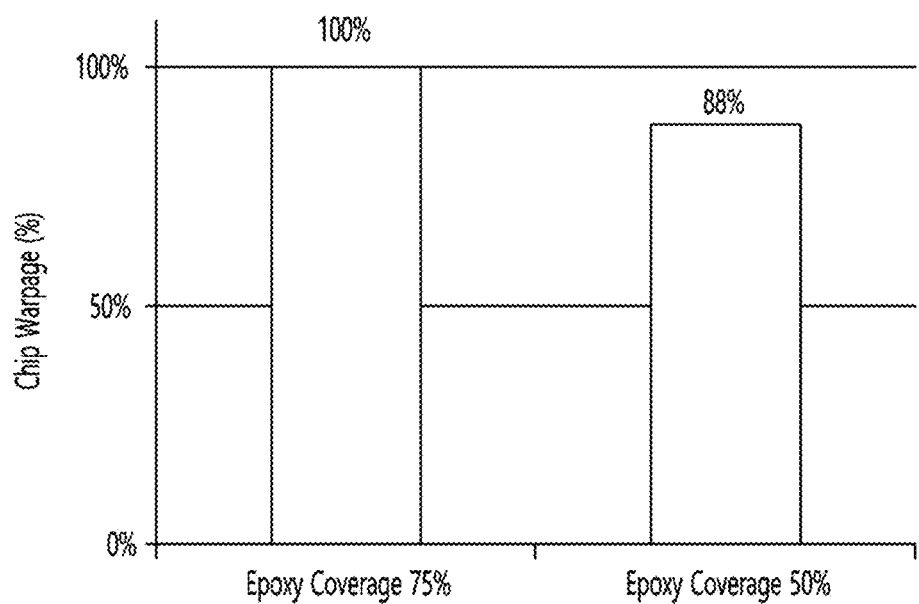
FIG. 8 is a view illustrating a degree of occurrence of warpage according to an arrangement area of a first adhesive member.
Figure 9:
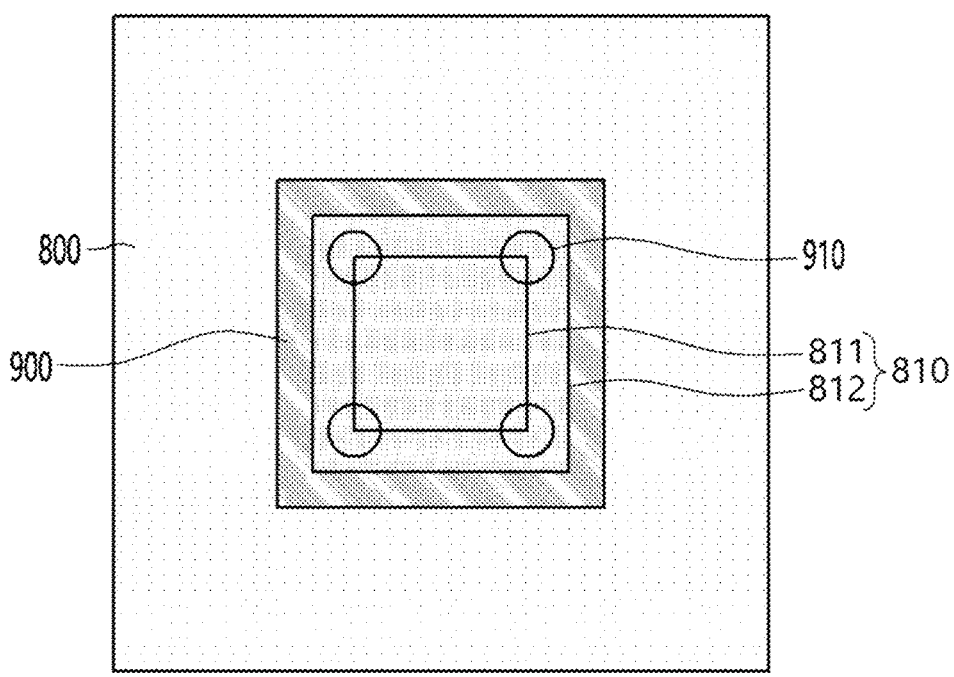
FIGS. 9 and 10 are views illustrating an arrangement relationship between a bump part and the image sensor according to a first embodiment.
Figure 10:
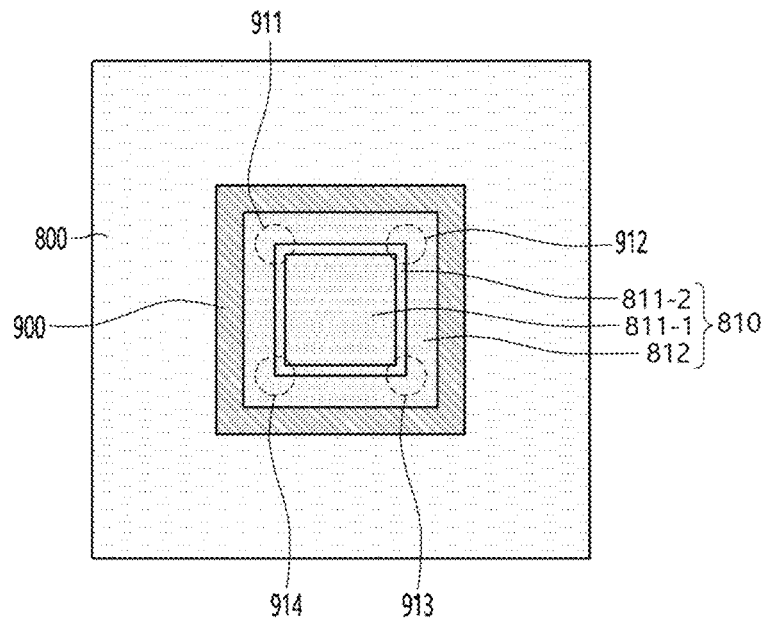

FIG. 6 is a plan view showing a circuit board, a reinforcing plate, a bump part, and a first adhesive member before an image sensor according to the first embodiment is attached, FIG. 7 is a view illustrating various embodiments of an arrangement shape of a first adhesive member, FIG. 8 is a view illustrating a degree of occurrence of warpage according to an arrangement area of a first adhesive member, FIGS. 9 and 10 are views illustrating an arrangement relationship between a bump part and the image sensor according to a first embodiment.

FIGS. 6 to 10, the reinforcing plate 900 includes a first region S1 and a second region S2.

In addition, an upper surface of the first region S1 of the reinforcing plate 900 may be exposed through the cavity 801 of the circuit board 800. The first region S1 may be a region in which the image sensor 810 is disposed in the cavity 801 of the circuit board 800, and the second region S2 may be a region in which the circuit board 800 is disposed.

Specifically, the first region S1 of the reinforcing plate 900 includes a first-first region S1-1 in which the first adhesive member 1750 is disposed and a first-second region S1-2 in which the bump part 910 is disposed. The first region S1 may correspond to the shape of the image sensor 810. For example, the first region S1 may have a rectangular shape corresponding to the shape of the image sensor 810, but is not limited thereto.

A first bump part 911, a second bump part 912, a third bump part and a fourth bump part may be formed in the first-second region S1-2. In this case, the first bump part 911, the second bump part 912, the third bump part 913, and the fourth bump part 914 may be spaced apart from each other in the first region S1. For example, the first bump part 911, the second bump part 912, the third bump part 913, and the fourth bump part 914 may be positioned in a region overlapping the corner region of the lower surface of the image sensor 810 in the optical axis direction in the first region S1. Accordingly, the first-second region S1-2 may be a region overlapping the corner region of the lower surface of the image sensor 810 in the optical axis direction.

A first adhesive member 1750 may be disposed in the first-first region S1-1. For example, the first adhesive member 1750 may be disposed at a position spaced apart from the first bump parts while the first bump part 911, the second bump part 912, the third bump part 913, and the fourth bump part 914 are not disposed.

In the embodiment, the image sensor 810 is attached or fixed on the reinforcing plate 900 through the first adhesive member 1750 in a state in which the corner region of the image sensor 840 is supported through the first bump part 911, the second bump part 912, the third bump part 913, and the fourth bump part 914.

For example, the first adhesive member in the comparative example was formed on the reinforcing plate, and thus the image sensor was attached on the first adhesive member. Specifically, the first adhesive member in the comparative example was applied to the entire region overlapping the image sensor in the optical axis direction.

Alternatively, the first adhesive member 1750 in the embodiment may be formed only on a partial region of the lower surface of the image sensor 810. Accordingly, an area of a lower surface of the image sensor 810 may be greater than an area of an upper surface of the first adhesive member 1750. For example, an area of an upper surface of the first adhesive member 1750 may be less than 80% of an area of a lower surface of the image sensor 810. For example, the area of the upper surface of the first adhesive member 1750 may be less than or equal to 70% of the area of the lower surface of the image sensor 810. For example, the area of the upper surface of the first adhesive member 1750 may be less than or equal to 60% of the area of the lower surface of the image sensor 810. For example, the area of the upper surface of the first adhesive member 1750 may be less than or equal to 50% of the area of the lower surface of the image sensor 810.

Preferably, the area of the upper surface of the first adhesive member 1750 is 50% or less of the area of the lower surface of the image sensor 810. According to this, the arrangement area of the first adhesive member 1750 in the embodiment is reduced compared to the area of the image sensor 810, and accordingly, it is possible to minimize the warpage that increases in proportion to the area of the first adhesive member 1750.

Referring to FIG. 7, as in (a), (b) and (c), the first adhesive member 1750 may have various shapes and may be applied on the reinforcing plate 900. However, the first adhesive member 1750 in the embodiment has a snowflake shape as in (c) of FIG. 7. That is, it was confirmed that a change in the degree of warpage occurs also depending on the application shape of the first adhesive member 1750, and when the first adhesive member 1750 is applied in the shape as shown in FIG. 7(*c*), as a result, it was confirmed that the degree of occurrence of warpage was the lowest.

Also, referring to FIG. 8, when the area of the first adhesive member 1750 is 75% or more of the area of the lower surface of the image sensor 810, the degree of warpage of the image sensor 810 is 100%, when the area of the first adhesive member 1750 is 50% of the area of the lower surface of the image sensor 810, it can be confirmed that the degree of warpage of the image sensor 810 is 88%, which is smaller than 100.

In other words, as the area of the first adhesive member 1750 in contact with the image sensor 810 decreases, the influence of the coefficient of thermal expansion is reduced, and thus it can be seen that the degree of warpage is reduced.

Accordingly, the area of the portion in contact with the first adhesive member 1750 compared to the total area of the lower surface of the image sensor 810 in the embodiment is 50% or less, and accordingly, the occurrence of warpage of the image sensor 810 is minimized. However, when the area of the first adhesive member 1750 is reduced to 30% or less, the attachment or fixation force of the image sensor 810 may be reduced. Accordingly, the area of the first adhesive member 1750 is in a range of 30% to 50% of the area of the image sensor 810.

As described above, only a partial region of the lower surface of the image sensor 810 in the embodiment is in contact with the first adhesive member 1750, and accordingly, the occurrence of warpage of the image sensor 810 may be minimized, and thus the performance of the image sensor may be improved.

Meanwhile, the first adhesive member 1750 may be formed on the first-first region S1-1 of the first region S1 of the reinforcing plate 900. For example, the first adhesive member 1750 may be formed in the remaining region of the first region S1 of the reinforcing plate 900 except for the corner region. For example, the first adhesive member 1750 may have various shapes (preferably a snowflake shape) on the first-first region S1-1 of the reinforcing plate 900.

The bump part 910 may be formed on the first-second region S1-2 of the first region S1 of the reinforcing plate 900. For example, the bump part 910 may be formed in a corner region of the first region S1 of the reinforcing plate 900.

The bump part 910 may include a first bump part 911 formed in a first corner region of the first region S1 of the reinforcing plate 900. The bump part 910 may include a second bump part 912 formed in a second corner region of the first region S1 of the reinforcing plate 900. The bump part 910 may include a third bump part 913 formed in a third corner region of the first region S1 of the reinforcing plate 900. The wire part may include a fourth bump part 911 formed in a fourth corner region of the first region S1 of the reinforcing plate 900.

The plurality of bump part 910 may be spaced apart from the first adhesive member 1750 on the first region S1 of the reinforcing plate 900. For example, the first adhesive member 1750 may not contact the bump part 910. Accordingly, heat generated through the image sensor 810 in an embodiment may be radiated to the outside through a plurality of branched paths, and thus heat dissipation performance may be improved.

Meanwhile, the number of the bump part 910 was four in the above description, the embodiment is not limited thereto. For example, the bump part 910 may further include a sub bump part formed between adjacent corner regions among the four corner regions.

The bump part 910 may be spaced apart from in inner wall of the cavity 801 by a predetermined interval within the cavity 801 of the circuit board 800. For example, the interval of 100 μm to 250 μm may exist between the bump part 910 and the inner wall of the cavity 801 of the circuit board 800. When the interval is less than 100 μm, an attachment tolerance for attaching the circuit board 800 to the reinforcing plate 900 becomes small, so that misalignment between the cavity 801 of the circuit board 800 and the bump part 910 occurs. Also, the circuit board 800 may be damaged due to collision between the circuit board 800 and the bump part 910. In addition, when the interval exceeds 250 μm, a separation distance between the image sensor and the circuit board increases, so that the reliability of wire bonding to the connection wire 21 may deteriorate.

The bump part 910 may overlap a specific region of the image sensor 810 in an optical axis direction. Preferably, the second bump 910b constituting the bump part 910 may overlap a specific region of the image sensor 810 in an optical axis direction.

For example, the image sensor 810 may include a pixel region 811 including a plurality of pixels for detecting an optical image (image information) incident through a lens, and a passivation region 812 other than the pixel region.

In this case, the bump part 910 may be formed such that at least a portion of the pixel region 810 overlaps in the corner region of the image sensor 810. For example, the bump part 910 may be formed in a region overlapping the pixel region 811 of the image sensor 810 in the optical axis direction OA in the first region S1 of the reinforcing plate 900.

Specifically, the pixel region of the image sensor 810 may include an active pixel region 811-1 used to detect actual image information, and a dummy pixel region 811-2 other than the active pixel region 811-1. The active pixel region 811-1 may be used to generate image information using incident light. The dummy pixel region 811-2 is not used to generate image information, but may have the same structure as the active pixel region 811-1. That is, the image sensor 810 includes a dummy pixel region 811-2 between the active pixel region 811-1 generating actual image information and the passivation region 812 for protection thereof in order to increase reliability in the generation of image information.

And, the bump part 910 in the embodiment may overlap a corner region of the active pixel region 811-1 of the image sensor in the optical axis direction. That is, the region in which flatness is most important in the image sensor 810 is the active pixel region 811-1, and the flatness of the active pixel region 811-1 substantially determines the performance and operational reliability of the image sensor 810. Accordingly, at least a portion of the active pixel region 811-1 in the embodiment may be supported by the bump part 910.

In addition, the bump part 910 in the embodiment overlaps at least a portion of a corner region of the active pixel region 811-1 in the optical axis direction. Accordingly, a lower surface of the image sensor 810 corresponding to the active pixel region 811-1 in the embodiment may be supported by the bump part 910, so that it is possible to minimize the occurrence of warpage of the active pixel region 811-1 of the image sensor 810.

That is, when the bump part 910 overlaps the active pixel region 811-1 in the optical axis direction, the overall flatness of the active pixel region 811-1 may be maintained, and accordingly, it is possible to minimize the occurrence of warpage of the active pixel region 811-1 of the image sensor 810.

Figure 11:
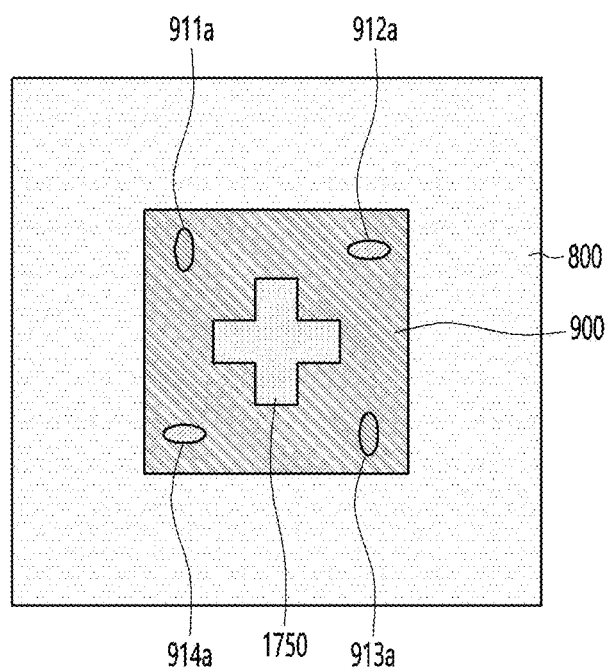
Figure 12:
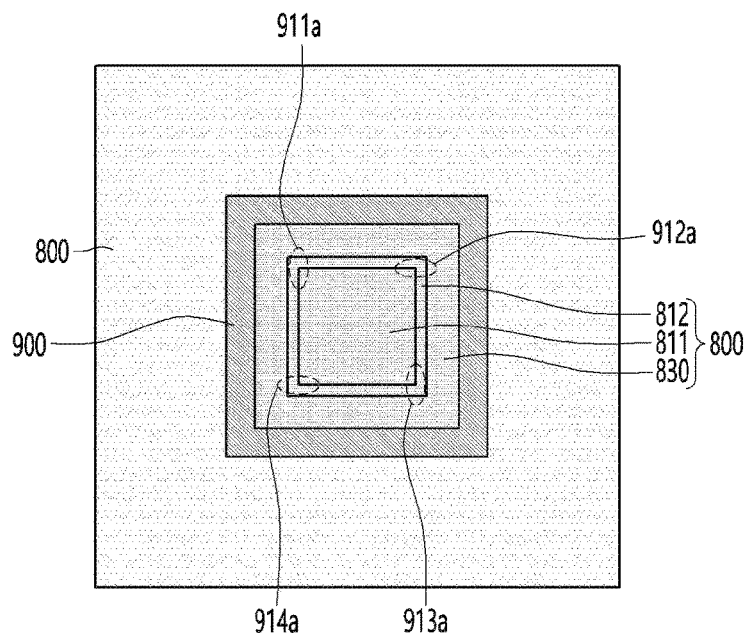

FIG. 11 is a plan view illustrating a circuit board, a reinforcing plate, a bump part, and a first adhesive member before an image sensor is attached according to a second embodiment, and FIG. 12 is a diagram for explaining an arrangement relationship between a bump part and the image sensor according to the second embodiment.

The bump part 910 in the first embodiment has a circular cross section. Unlike this, the bump part in the second embodiment may have an elliptical cross section.

Referring to FIGS. 11 and 12, the first to fourth bump parts 911a, 911b, 911c, and 911d are formed in an elliptical shape, and accordingly, it may be disposed in a direction connecting adjacent corner regions among a plurality of corner regions of the image sensor 810. In this case, bump parts adjacent to each other in the first to fourth bump parts 911a, 911b, 911c, and 911d may be arranged in different directions.

For example, the first to fourth bump parts 911a, 911b, 911c, and 911d have an elliptical shape, and thus may be divided into a major axis direction and a minor axis direction. Further, a major axis of the first bump part 911a may be arranged in a length direction on the reinforcing plate 900. In addition, a major axis of the second bump part 911b may be arranged in a width direction on the reinforcing plate 900. In addition, a major axis of the third bump part 911c may be arranged in a length direction on the reinforcing plate 900. In addition, a major axis of the fourth bump part 911d may be arranged in a width direction on the reinforcing plate 900. As described above, in the embodiment, the major axes of the first to fourth bump parts 911a, 911b, 911c, and 911d having an elliptical shape are arranged in different directions on the reinforcing plate 900. Accordingly, the embodiment may more stably support the image sensor 810 to improve the flatness of the image sensor 810.

Figure 13:
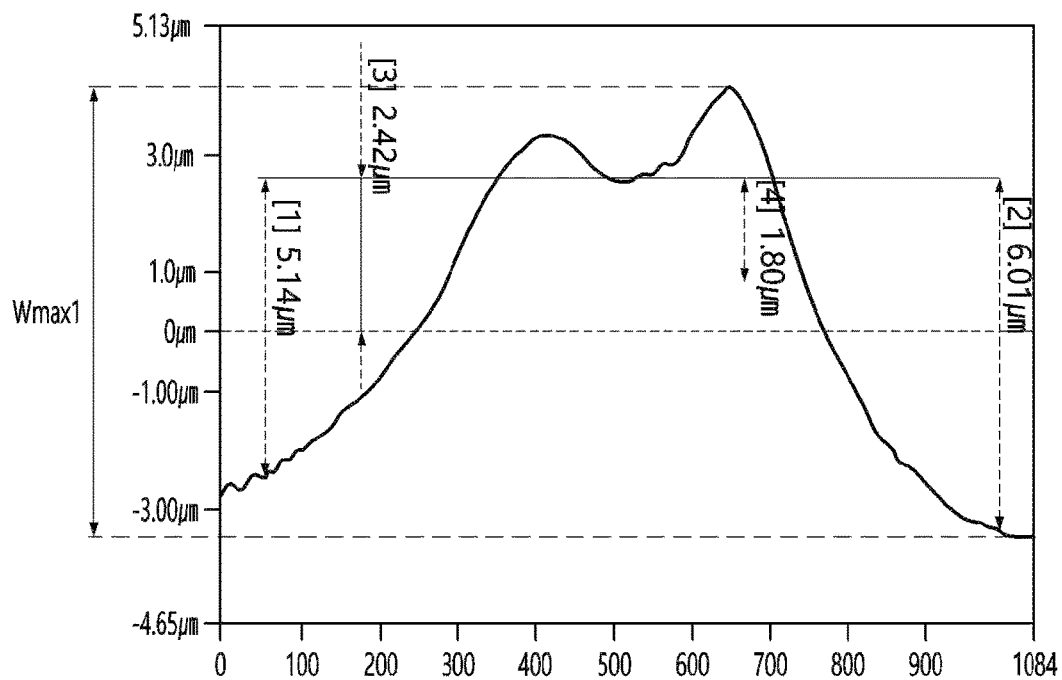
FIG. 13 is a graph illustrating a degree of warpage of an image sensor according to a comparative example.
Figure 14:
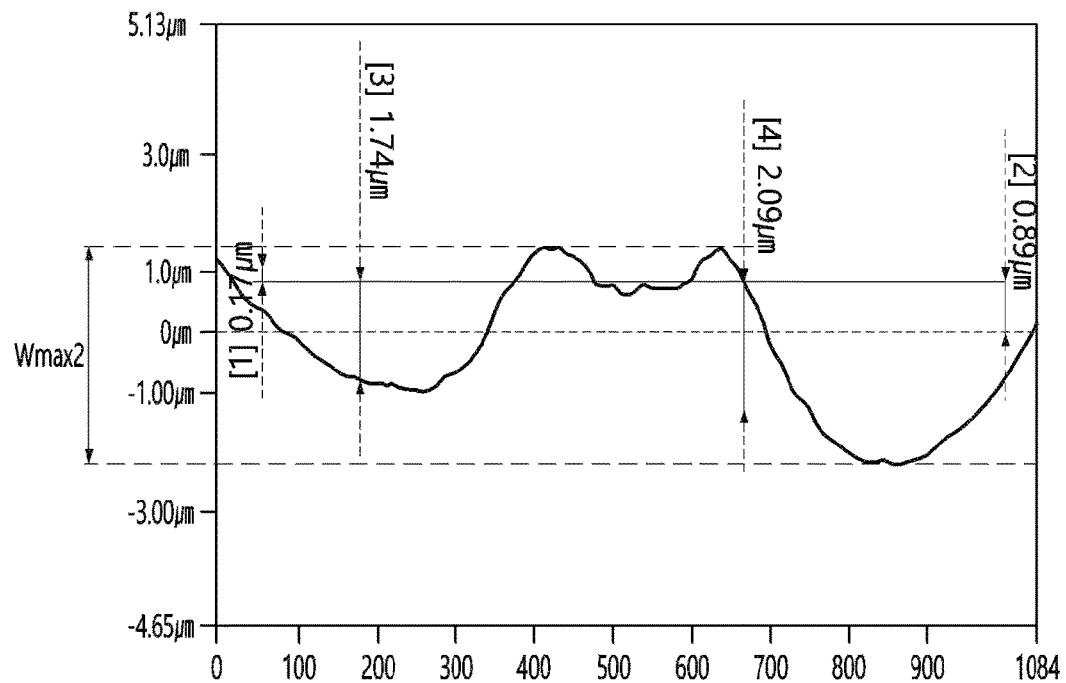
FIG. 14 is a graph illustrating a degree of warpage of an image sensor including a bump part according to an embodiment.

FIG. 13 is a graph illustrating a degree of warpage of an image sensor according to a comparative example, and FIG. 14 is a graph illustrating a degree of warpage of an image sensor including a bump part according to an embodiment.

FIG. 13 illustrates values of the degree of warpage for each position of an image sensor according to a comparative example. For example, a x-axis of the graph of FIG. 13 represents the position of the image sensor, and a y-axis represents the height or degree of warpage at each position.

Referring to FIG. 13, in the comparative example, it was confirmed that the maximum degree of warpage (Wmax 1) in a center portion and an edge region of the image sensor 810 was 7.74 μm.

* FIG. 14 shows values of the degree of warpage by position of an image sensor in a structure including a bump part according to an embodiment. For example, a x-axis of the graph of FIG. 14 represents the position of the image sensor, and a y-axis represents the height or degree of warpage at each position.

Referring to FIG. 14, when including bump part 910, it was confirmed that the maximum degree of warpage (Wmax 2) in the center portion and the edge region of the image sensor 810 had 4.42 μm, and it was confirmed that this was actually about 57% of the degree of warpage of the comparative example.

A camera module and an optical device including the camera module according to the embodiment include a bump part. The bump part may be formed by bonding a metal wire on a reinforcing plate. In this case, a region overlapping the image sensor in an optical axis direction among the upper surface of the reinforcing plate includes a region in which the bump part is disposed, and a region in which an adhesive member for attaching or fixing the image sensor is disposed. In other words, the adhesive member may be selectively disposed on a region of the upper surface of the reinforcing plate in which the bump part is not formed. In addition, the embodiment may be attached or fixed on the reinforcing plate by the adhesive member in a state in which at least a portion of the lower surface of the image sensor is in direct contact with and supported by the bump part. Accordingly, the embodiment may minimize a warpage phenomenon of the image sensor by allowing at least a part of the image sensor to directly contact and support the bump part, thereby improving the operation reliability of the camera module.

Furthermore, in the embodiment, at least a portion of the image sensor is in direct contact with the bump part, and the bump part is in direct contact with the reinforcing plate, so that heat generated from the image sensor can be efficiently transferred to the outside.

In addition, the embodiment allows an area of the adhesive member disposed on the lower surface of the image sensor to be smaller than an area of the lower surface of the image sensor. Accordingly, the embodiment may minimize the warpage phenomenon of the image sensor that occurs as an arrangement area of the adhesive member increases compared to the area of the image sensor.

In addition, the embodiment allows at least a portion of an edge region of an active pixel region of the image sensor to be supported by the bump part in the optical axis direction. Accordingly, the embodiment may secure the flatness of the active pixel region, thereby improving the quality of the image obtained by the image sensor.

Figure 15:
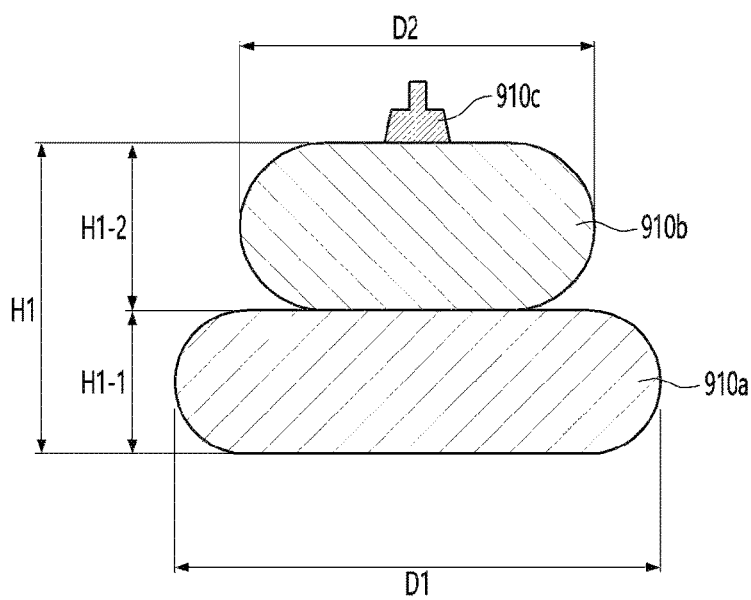
FIG. 15 is a view illustrating a shape of a bump part according to another embodiment.

FIG. 15 is a view illustrating a shape of a bump part according to another embodiment.

Referring to FIG. 15, the bump part includes the first bump 910a and the second bump 910b described above. In this case, the first bump 910a and the second bump 910b have already been described with reference to FIG. 5, and accordingly, a description thereof will be omitted.

The bump part 910 of the embodiment may include an extension part 910c disposed on the second bump 910b. The extension part 910c may protrude upward with a certain height from the upper surface of the second bump 910b. The extension part 910c may include a first portion having a trapezoidal shape and a second portion on the first portion. The first portion may be a part formed in a process of completing a bonding process after forming the second bump 910b. In addition, the second portion may be a portion where the metal wire is finally cut after the formation of the bump part 910 is completed. The extension part 910c may be a part formed in a process of finally cutting the metal wire after forming the second bump 910b. However, the extension part 910c may be removed by pressing force in a process of seating the image sensor 810 on the bump part 910. For example, the extension part 910c may be removed by being pressed during the process of attaching or fixing the image sensor 810. Preferably, the extension part 910c may be included in the second bump 910b by being pressed. However, at least a portion of the extension portion 910c may remain on the second bump 910b based on the pressing force generated in the process of attaching or fixing the image sensor 810 or the thickness of the first adhesive member 1750. In addition, in this case, the second bump 910b may include a portion of the remaining extension part 910c.

Figure 16:
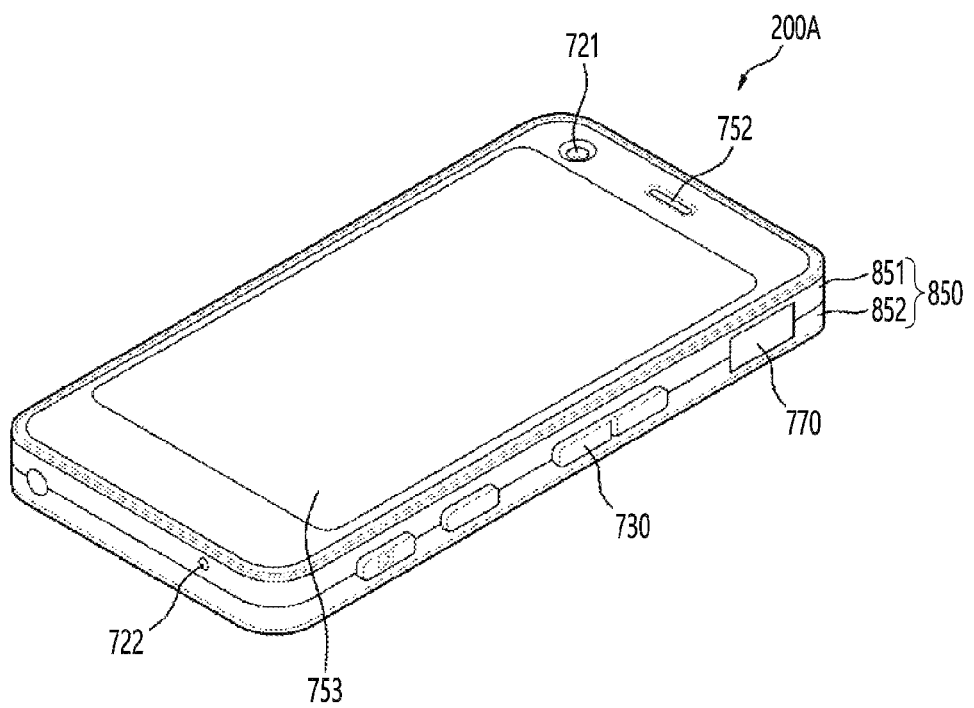
FIG. 16 is a perspective view of a portable terminal according to an embodiment.
Figure 17:
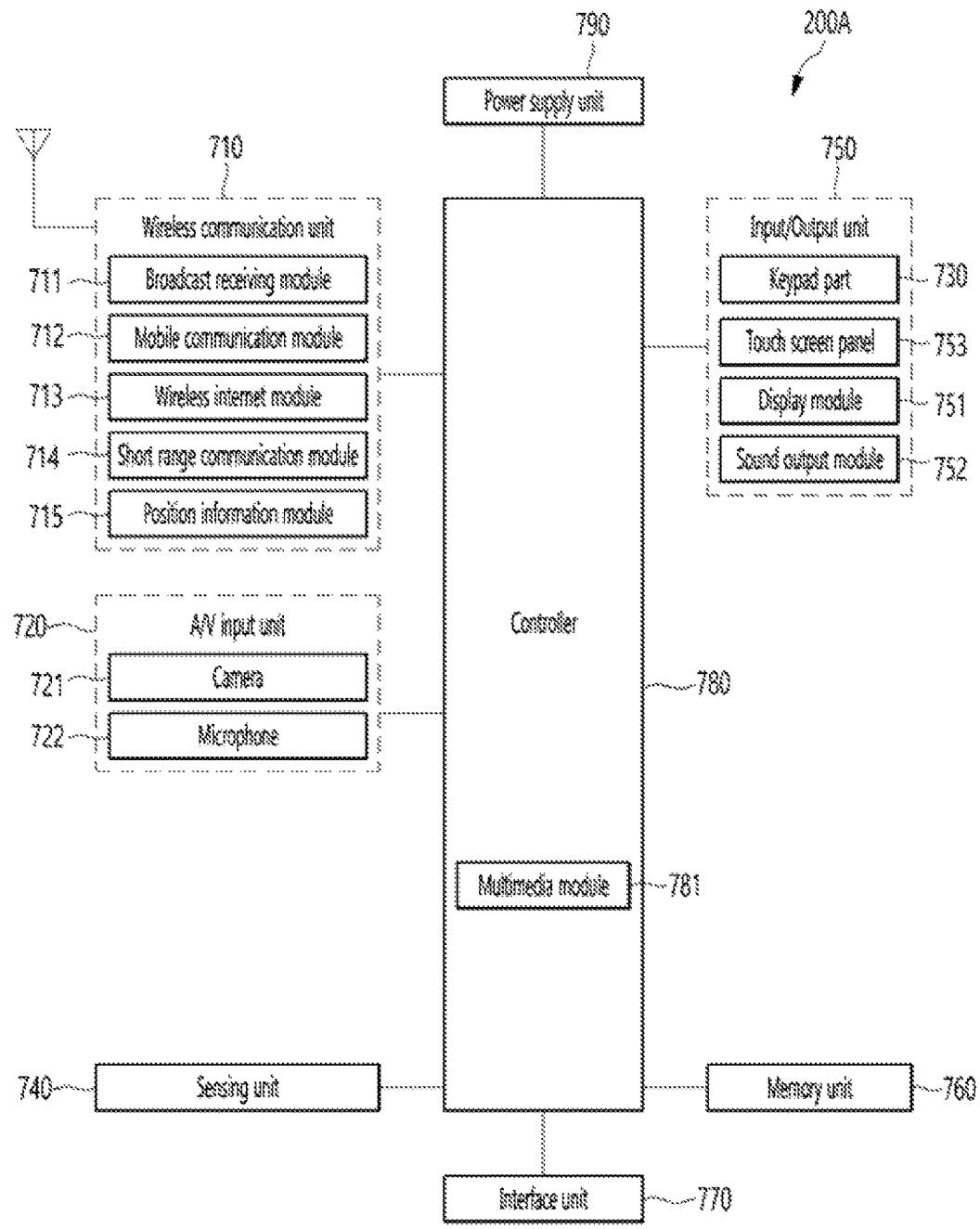
FIG. 17 is a block diagram of the portable terminal shown in FIG. 16.

FIG. 16 is a perspective view of a portable terminal 200A according to an embodiment, and FIG. 17 is a block diagram of the portable terminal shown in FIG. 16.

FIGS. 16 and 17, the portable terminal (200A, hereinafter referred to as "terminal") may include a body 850, a wireless communication unit 710, an A/V input unit 720, and a sensing unit 740, an input/output unit 750, a memory unit 760, an interface unit 770, a control unit 780, and a power supply unit 790.

The body 850 shown in FIG. 16 is in the form of a bar, but is not limited thereto, and there may be various structures such as a slide type, a folder type, a swing type, a swivel type, in which two or more sub-bodies are coupled to be movable relative to each other.

The body 850 may include a case (casing, housing, cover, etc.) forming an exterior. For example, the body 850 may be divided into a front case 851 and a rear case 852. Various electronic components of the terminal may be embedded in a space formed between the front case 851 and the rear case 852.

The wireless communication unit 710 may include one or more modules that enable wireless communication between the terminal 200A and the wireless communication system or between the terminal 200A and the network in which the terminal 200A is located. For example, the wireless communication unit 710 may include a broadcast reception module 711, a mobile communication module 712, a wireless internet module 713, a short-range communication module 714, and a location information module 715.

The A/V (Audio/Video) input unit 720 is for inputting an audio signal or a video signal, and may include a camera 721 and a microphone 722 and the like.

The camera 721 may include a camera module according to the embodiment shown in FIG. 2.

The sensing unit may detect a current state of the terminal 200A, such as an opening/closing state of the terminal 200A, a position of the terminal 200A, a presence or absence of user contact, an orientation of the terminal 200A, acceleration/deceleration of the terminal 200A, etc. and generate a sensing signal for controlling the operation of the terminal 200A. For example, when the terminal 200A is in the form of a slide phone, it is possible to sense whether the slide phone is opened or closed. In addition, it is responsible for sensing functions related to whether the power supply unit 790 is supplied with power, whether the interface unit 770 is coupled to an external device, and the like.

The input/output unit 750 is for generating input or output related to sight, hearing, or touch. The input/output unit 750 may generate input data for operation control of the terminal 200A, and may also display information processed by the terminal 200A.

The input/output unit 750 may include a keypad unit 730, a display module 751, a sound output module 752, and a touch screen panel 753. The keypad unit 730 may generate input data in response to a keypad input.

The display module 751 may include a plurality of pixels whose color changes according to an electrical signal. For example, the display module 751 may include at least of a liquid crystal display, a thin film transistor-liquid crystal display, an organic light-emitting diode, a flexible display, three-dimensional display (3D display).

The sound output module 752 may output audio data received from the wireless communication unit 710 in a call signal reception, a call mode, a recording mode, a voice recognition mode, or a broadcast reception mode, or the like; or audio data stored in the memory unit 760.

The touch screen panel 753 may convert a change in capacitance generated due to a user's touch on a specific region of the touch screen into an electrical input signal.

The memory unit 760 may store a program for processing and control of the controller 780, and may temporarily store input/output data (eg, phone book, message, audio, still image, photo, video, etc.). For example, the memory unit 760 may store an image captured by the camera 721, for example, a photo or a moving picture.

The interface unit 770 serves as a passage for connecting with an external device connected to the terminal 200A. The interface unit 770 receives data from an external device, receives power and transmits it to each component inside the terminal 200A, or transmits data of the terminal 200A to an external device. For example, the interface unit 770 may include a wired/wireless headset port, an external charger port, a wired/wireless data port, a memory card port, a port for connecting a device having an identification module, and an audio I/O (Input/Output) port, video I/O (Input/Output) port, and an earphone port, and the like.

The controller (controller, 780) may control the overall operation of the terminal 200A. For example, the controller 780 may perform related control and processing for voice calls, data communications, video calls, and the like.

The controller 780 may include a multimedia module 781 for playing multimedia. The multimedia module 781 may be implemented within the controller 180 or may be implemented separately from the controller 780.

The controller 780 may perform a pattern recognition process capable of recognizing a handwriting input or a drawing input performed on the touch screen as characters and images, respectively.

The power supply unit 790 may receive external power or internal power under the control of the control unit 780 to supply power required for the operation of each component.

Although the embodiments of the present invention have been described with reference to the accompanying drawings, those skilled in the art to which the present invention pertains will be understood that the present invention may be implemented in other specific forms without modifying the technical spirit and essential features of the present invention. Therefore, it should be understood that the embodiments described above are illustrative in all aspects and not restrictive.

What is claimed is:

1. A camera module comprising:
   a reinforcing plate;
   a bump part disposed on the reinforcing plate;
   a first adhesive member disposed on the reinforcing plate;
   a circuit board disposed on the reinforcing plate and including a cavity vertically overlapping the bump part and the first adhesive member; and
   an image sensor disposed on the bump part and the first adhesive member,
   wherein the image sensor is supported by the bump part and is disposed in the cavity, and
   wherein the image sensor overlaps the first adhesive member and the bump part in a vertical direction, and the first adhesive member is spaced apart from the bump part in a horizontal direction.

2. The camera module of claim 1, wherein the bump part includes:
   a first bump disposed on the reinforcing plate and having a first height; and
   a second bump disposed on the first bump and having a second height different from the first height; and
   wherein an upper surface of the second bump is in direct contact with a lower surface of the image sensor.

3. The camera module of claim 2, wherein a side surface of each of the first bump and the second bump includes a curved surface.

4. The camera module of claim 2, wherein the reinforcing plate includes a region vertically overlapping the cavity, and
   wherein the bump part is disposed in plurality on the region vertically overlapping the cavity on the upper surface of the reinforcing plate.

5. The camera module of claim 1, wherein a thickness of the bump part is same as a thickness of the first adhesive member.

6. The camera module of claim 2, wherein the bump part is composed of a metal wire having a diameter in a range of 22 μm to 28 μm.

7. The camera module of claim 6, wherein the first height of the first bump is in a range of 50% to 90% of the diameter of the metal wire.

8. The camera module of claim 6, wherein the second height of the second bump is in a range of 115% to 170% of the diameter of the metal wire.

9. The camera module of claim 7, wherein the first height of the first bump is in a range of 11 μm to 26 μm.

10. The camera module of claim 8, wherein the second height of the second bump is in a range of 28 μm to 44 μm.

11. The camera module of claim 2, wherein the first bump has a first width, and
wherein the second bump has a second width smaller than the first width.

12. The camera module of claim 11, wherein the first width of the first bump is in a range of 70 μm to 97 μm; and
wherein the second width of the second bump is in a range of 50 μm to 80 μm.

13. The camera module of claim 1, comprising:
a second adhesive member disposed between the circuit board and the reinforcing plate,
wherein a thickness of the second adhesive member is smaller than a thickness of the first adhesive member.

14. The camera module of claim 1, wherein an area of the first adhesive member is 50% or less of an area of the image sensor.

15. The camera module of claim 4, wherein the plurality of bump parts overlap a corner region of the lower surface of the image sensor in an optical axis direction.

16. The camera module of claim 1, wherein the bump part is spaced apart from an inner wall of the cavity of the circuit board by a first separation distance.

17. The camera module of claim 2, wherein the image sensor includes a pixel region and a non-pixel region around the pixel region, and
wherein the bump part overlaps the pixel region of the image sensor in an optical axis direction.

18. The camera module of claim 17, wherein the pixel region of the image sensor includes:
an active pixel region; and
a dummy pixel region between the active pixel region and the passivation non-pixel region; and
wherein at least a portion of the second bump of the bump part overlaps the active pixel region in the optical axis direction.

19. The camera module of claim 6, wherein the circuit board includes a first terminal,
wherein the image sensor includes a second terminal,
wherein the camera module comprises a connection wire electrically connecting the first terminal and the second terminal, and
wherein the connection wire includes a same material as a material of the metal wire constituting the bump part.

20. An optical device comprising:
a body, a camera module disposed at the body and configured to capture an image of a subject, and a display unit disposed at the body and configured to output the image captured by the camera module,
wherein the camera module comprises:
a reinforcing plate;
a circuit board disposed on the reinforcing plate and including a cavity and a first terminal;
a bump part disposed on the reinforcing plate and exposed through the cavity of the circuit board;
a first adhesive member disposed on the reinforcing plate;
an image sensor disposed on the bump part and the first adhesive member and including a second terminal; and
a wire part connecting the first terminal and the second terminal,
wherein the bump part includes a first bump disposed on the reinforcing plate and having a first height; and a second bump disposed on the first bump and having a second height different from the first height;
wherein an upper surface of the second bump is in direct contact with a lower surface of the image sensor;
wherein the bump part is composed of a metal wire having a diameter in a range of 22 μm to 28 μm,
wherein the first height of the first bump is in a range of 50% to 90% of the diameter of the metal wire,
wherein the second height of the second bump is in a range of 115% to 170% of the diameter of the metal wire,
wherein the image sensor overlaps the first adhesive member and the bump part in a vertical direction, and the first adhesive member is spaced apart from the bump part in a horizontal direction, and
wherein a thickness of the bump part is same as a thickness of the first adhesive member.

* * * * *